United States Patent [19]

Tsuchiya et al.

[11] 4,344,001
[45] Aug. 10, 1982

[54] CLOCKING SIGNAL DRIVE CIRCUIT FOR CHARGE TRANSFER DEVICE

[75] Inventors: Takao Tsuchiya; Mitsuo Soneda, both of Fujisawa, Japan

[73] Assignee: Sony Corporation, Tokyo, Japan

[21] Appl. No.: 102,839

[22] Filed: Dec. 12, 1979

[30] Foreign Application Priority Data

Dec. 19, 1978 [JP] Japan ............................ 53-157131
Dec. 19, 1978 [JP] Japan ............................ 53-157134
Dec. 26, 1978 [JP] Japan ............................ 53-163705
Apr. 23, 1979 [JP] Japan ............................ 54-49946

[51] Int. Cl.³ ............... G11C 19/28; H03K 17/60; H03K 17/56; H03K 5/00
[52] U.S. Cl. ....................... 307/221 D; 307/255; 307/262; 307/313; 357/24; 333/165
[58] Field of Search ......... 357/24; 307/221 C, 221 D, 307/255, 262, 313; 333/165

[56] References Cited

U.S. PATENT DOCUMENTS

| | | | |
|---|---|---|---|
| 3,546,490 | 12/1970 | Sangster | 357/24 |
| 3,621,283 | 11/1971 | Teer et al. | 307/221 D |
| 3,651,340 | 3/1972 | Cliff | 307/313 |
| 3,798,471 | 3/1974 | Williams et al. | 307/255 |
| 3,916,219 | 10/1975 | Wilmsmeyer | 307/221 D |
| 3,937,982 | 2/1976 | Nakajima | 307/221 C |
| 3,983,408 | 9/1976 | Adam et al. | 307/221 D |
| 3,983,409 | 9/1976 | Adam | 307/221 D |

*Primary Examiner*—Gene M. Munson

*Attorney, Agent, or Firm*—Lewis H. Eslinger; Alvin Sinderbrand

[57] ABSTRACT

A clocking signal drive circuit supplies at least one clocking signal in a charge transfer device which has a plurality of successive capacitive storage elements for sequentially holding a charge level representing a time sampled input signal, with each of the capacitive storage elements having a clocking electrode for receiving one of a plurality of clocking signals so that the charge level representing the time sampled input signal is transferred from one to another of the capacitive storage means in succession in response to the clocking signals. The clocking signal drive circuit includes a clocking signal generator having an output at which the generator provides a clocking control signal, and a pair of complementary transistors each having first, second, and control electrodes, with the control electrode of the complementary transistors being connected together and to the output of the clocking signal generator and the first electrodes of the complementary transistors being connected together and to the clocking electrode of at least one of the capacitive storage elements. In one embodiment of the invention the clocking signal drive circuit functions as an output device for detecting the charge level on at least one of the capacitive storage elements of the charge transfer device, and further includes a detector for determining the amount of current which flows from the clocking signal drive circuit to the clocking electrode or electrodes to which it is connected.

21 Claims, 32 Drawing Figures

FIG. 2A ($\phi_1$)

FIG. 2B ($\phi_2$)

CLOCKING SIGNAL DRIVE CIRCUIT FOR CHARGE TRANSFER DEVICE

BACKGROUND OF THE INVENTION

1. Field of the Invention

This invention relates generally to charge transfer devices and, more particularly, is directed to an improved clocking signal drive circuit for the charge transfer devices.

2. Description of the Prior Art

Charge transfer devices (CTDs) are well-known in the prior art to include a plurality of capacitive storage elements each capable of capacitively holding a variable amount of charge. These capacitive storage elements are arranged in a series and connected so that, under the influence of a clocking signal, the charge on one of the capacitive storage elements will be transferred to the successive capacitive storage elements in the series.

Two well-known types of CTDs are the bucket brigade device (BBD) and the charge coupled device (CCD). A BBD is comprised of a series of capacitors, each having two plates, a series connected plate and a clocking plate. The series connected plate of each capacitor is connected to the series connected plate of the preceding capacitor by a transfer transistor. The clocking plate of each capacitor and the control electrode of each transfer transistor are each supplied with one of a plurality of clocking signals. An input signal voltage is applied across the first capacitor in the series of capacitors which places a voltage having a corresponding signal level on the first capacitor. The voltage of the clocking signals are then varied so that the transfer transistor between the first and the second capacitors is turned on. As a result, charge flows from the second capacitor, which is originally charged with a standard voltage level higher than the signal level to the first capacitor. This transfer continues until the voltage across the first capacitor is raised from the signal level to the standard level at which point the voltage at the series plate of the first capacitor equals the voltage of the clocking signal supplied to the base of the transfer transistor which causes the transfer transistor to be turned off. This transfer of charge causes the voltage across the second capacitor, which has the same capacitance as the first, to drop from a standard level to the signal level. This process is repeated under the control of the clocking signals, so that the signal level originally placed on the first capacitor is sequentially transferred from one capacitor to another, enabling the BBD to store or delay, for a desired length of time the signal applied to its first capacitor.

A CCD is comprised of a series of successive electrodes each of which is capacitively coupled with a common semi-conductor channel and each of which is supplied with one of a plurality of clocking signals. An input signal voltage is applied between the first electrode of this series and the common channel, and results in the presence of charge in the common channel which is capacitively coupled to the first electrode. Then, the clocking signals cause different voltages to be applied to the first and second electrodes of the CCD, such that the charge formerly coupled to the first electrode is attracted to the second electrode. Under the control of the clocking signals, this process is repeated with the charge originally placed on the first electrode being sequentially transferred from one electrode to another, so that the CCD can store or delay, for a desired length of time, the signal applied to its first electrode.

The above description of BBDs and CCDs indicates the importance therein of clocking signal drive circuits which supply clocking signals to the capacitive storage means of such CTDs. In the prior art, such clocking signal drive circuits are comprised of a clock generator which provides one or more clocking control signals having the desired frequency and phase information for the generation of one or more clocking signals, and one or more driver circuits, each of which receives one of the clocking control signals and acts as a current amplifier for that signal so that the clocking signal which it provides to the CTD will be capable of properly driving that device. The driver circuits used in the prior art are comprised of a pair of NPN transistors connected in series between a power supply and ground with a diode having its anode connected to the emitter of the more positive of the two transistors and its cathode connected to the collector of the more negative of the two transistors. The base of the more positive of the two transistors is connected to the positive power supply through a resistor and to the collector of a third NPN transistor. The base of the more negative of the two transistors is connected to ground through a resistor and to the emitter of the third transistor. The base of the third transistor is connected to the collector of a fourth NPN transistor having its emitter connected to the output of the clock generator and its base connected to the positive power supply through a resistor.

As will be described in greater detail below, the foregoing circuit has many problems associated with its operations. First of all, it requires four transistors and a diode for each driver circuit, which increases the cost of the charge transfer device and which also increases the current demands required by such a driver circuit. Furthermore, such a driver circuit operates with some of its output transistors in saturation. This increases the time it takes for the driver circuit to change the clocking signal which it produces between low and high voltage levels. This has the undesirable effect of reducing the frequency at which the CTD can operate. In addition such a driver circuit has a disadvantage in that it cannot be used as an output device for measuring the charge level on one or more of the capacitive elements contained within a CTD.

In prior art charge transfer devices the standard means for measuring the charge level on one of the capacitive storage element is to connect one of the electrodes of such capacitive storage element to the base of a transistor connected to operate as an emitter follower, so that the voltage at the emitter of the emitter follower transistor will vary as a function of the voltage on the electrode of the charge transfer device to which its base is connected.

Such means for measuring the signal within a charge transfer device has two major drawbacks, the first of which is that there is a considerable stray capacitance $C_{CB}$ between the collector and the base of the emitter follower transistor. This stray capacitance has the effect of making it appear that the capacitance of the capacitive storage element to which the base of the emitter follower transistor is connected is larger than the capacitance of all the other capacitors of the CTD by the amount of $C_{CB}$. Such additional capacitance at the capacitive storage element to which the emitter follower transistor is connected destroys the uniform relationship which exists throughout the rest of the CTD between the voltage and the charge upon each of the capacitive storage elements. As a result, when charge flows from the capacitive storage element to which the emitter follower transistor is connected to its preceding capacitive storage element the decrease in the voltage of the discharging capacitive storage element will be less than the increase in voltage of the preceding capacitive storage element which is being charged. By reason of the foregoing, the final voltage across the capacitive storage element connected to the emitter follower transistor and the voltage at the emitter of such transistor will not accurately reflect the voltage which formerly was on the preceding capacitive storage element.

The use of an emitter follower transistor to measure the voltage on a capacitive storage element in a CTD gives rise to a further problem due to the base current in such a transistor. The base current drains charge from the capacitive storage element to which it is connected, thus decreasing the voltage across that capacitive storage element relative to what it should be, and thereby introducing an error in the output voltage measured at the emitter of the emitter follower transistor.

The use of emitter follower transistors to measure the voltage upon capacitive storage elements of a CTD has a further disadvantage when used with CTD which, as is well-known, are designed to function as filter circuits. At any given time, the charge level stored on every other capacitive storage element of a CTD is equal to a function of the charge level which was originally supplied to the input of the CTD at a time which varies for each such capacitive storage element according to the clocking frequency supplied to the charge transfer device and according to the sequential position of that capacitive storage element from the input of the CTD. By measuring the charge levels at a specified plurality of the capacitive storage elements, and by weighing the measured charge levels with a desired ratio and adding them together, it is possible to derive a value which varies as a function of the frequency of the input signal applied to the CTD. In such filter circuit according to the prior art, the charge level in each of the plurality of capacitive storage elements being sampled is determined by connecting the base of an emitter follower transistor with each such capacitive storage element while the emitter of each emitter follower transistor is connected to one input of a respective differential amplifier, which has its output connected to a device measuring the total amount of current flowing through all of the differential amplifiers.

Such a method of deriving the output from a filter circuit comprised of a CTD has many drawbacks. First of all, each of the emitter follower transistors connected to one of the capacitive storage elements of the CTD has an undesirable stray capacitance $C_{CB}$ and an undesirable base current, which not only decrease the accuracy of the measurement of the charge level on the respective capacitor, but also destroy the accuracy of that charge level as it is transferred onto successive capacitive storage element of the CTD. Further, the described prior art output circuit for a CTD filter circuit requires a large number of components, which increases the size, current requirements, and cost of the filter circuit. In addition, the prior art filter circuit has the undesirable feature of requiring that the current amplification of each its differential amplifiers be accurately fixed, which is quite difficult, particularly, in a filter circuit having many differential amplifiers.

OBJECTS AND SUMMARY OF THE INVENTION

Accordingly, it is an object of this invention to provide a clocking signal drive circuit that avoids the above-described difficulties encountered with clocking signal drive circuits in the prior art.

In addition, it is an object of this invention to provide a clocking signal drive circuit which can function as an output device for a CTD and which avoids the above-described difficulties encountered with the output devices of CTDs in the prior art.

Further, it is an object of this invention to provide a clocking signal drive circuit for use with CTDs which can rapidly switch its output between high and low voltage levels so that it can drive a CTD at a high frequency.

Another object of the present invention is to provide a clocking signal drive circuit, as aforesaid, which is relatively simple in construction, and thus which will decrease the cost, size and current requirements of a CTD with which it is used.

Still another object of the invention is to provide a clocking signal drive circuit for use with a CTD which can also function as a means for determining the charge level on one or more of the capacitive storage elements of the CTD with which it is used.

A further object of the invention is to provide an output device for a CTD which can accurately determine the charge level of one or more capacitive storage elements in the CTD, and which can do so without substantially changing any one of such charge levels.

A still further object of the invention is to provide an output device for a CTD acting as a transverse filter and which can produce an output varying accurately in proportion to a weighted sum of the charge levels on a plurality of the capacitive storage elements of the transverse filter without the large number of components required in the prior art, and without the need for accurately balanced differential amplifiers as also required in the prior art.

In accordance with an aspect of this invention, in a CTD including clocking signal drive means for supplying a plurality of clocking signals, and a plurality of successive capacitive storage means for sequentially holding a charge level representing a time sampled input signal, with each capacitive storage means having a clocking electrode for receiving one of the plurality of clocking signals and the charge level representing the time sampled input signal being transferred from one to another of the capacitive storage means in succession in response to the clocking signals; the clocking signal drive means comprises at least one clocking signal drive circuit which includes a clocking signal generator having an output to which that generator provides a clocking control signal, a pair of complementary transistors each having first, second, and control electrodes, means for connecting the control electrodes of the complementary transistors together and to the output of the clocking signal generator, and means for connecting the first electrode of the complementary transistors together and to the clocking electrode of at least one of the capacitive storage means of the CTD.

When such a clocking signal drive circuit functions as an output device for indicating the charge level on an at least one of the capacitive storage means of the CTD, one of the complementary transistors is an output transistor and the clocking signal drive circuit according to this invention further includes a detecting means connected to the second electrode of such output transistor for detecting a current flowing through the output transistor in series with the clocking electrode of the one or more capacitive storage means to which the first electrodes of the complementary transistors are connected.

The above, and other objects, features and advantages of the invention, will be apparent in the following detailed description of illustrative embodiments of the invention which is to be read in connection with the accompanying drawings.

BRIEF DESCRIPTION OF THE DRAWINGS

FIGS. 2A–2D are waveform diagrams showing first and second clocking signals in the BBD of FIG. 1 and the voltages at the more positive sides of odd and even numbered capacitors of such a BBD in response to the receipt of the clocking signals;

FIGS. 14 and 15 are schematic diagrams that correspond to FIGS. 12 and 13, respectively, but illustrating the use of field effect transistors instead of bi-polar transistors;

DETAILED DESCRIPTION OF PREFERRED EMBODIMENTS

Figure 1:
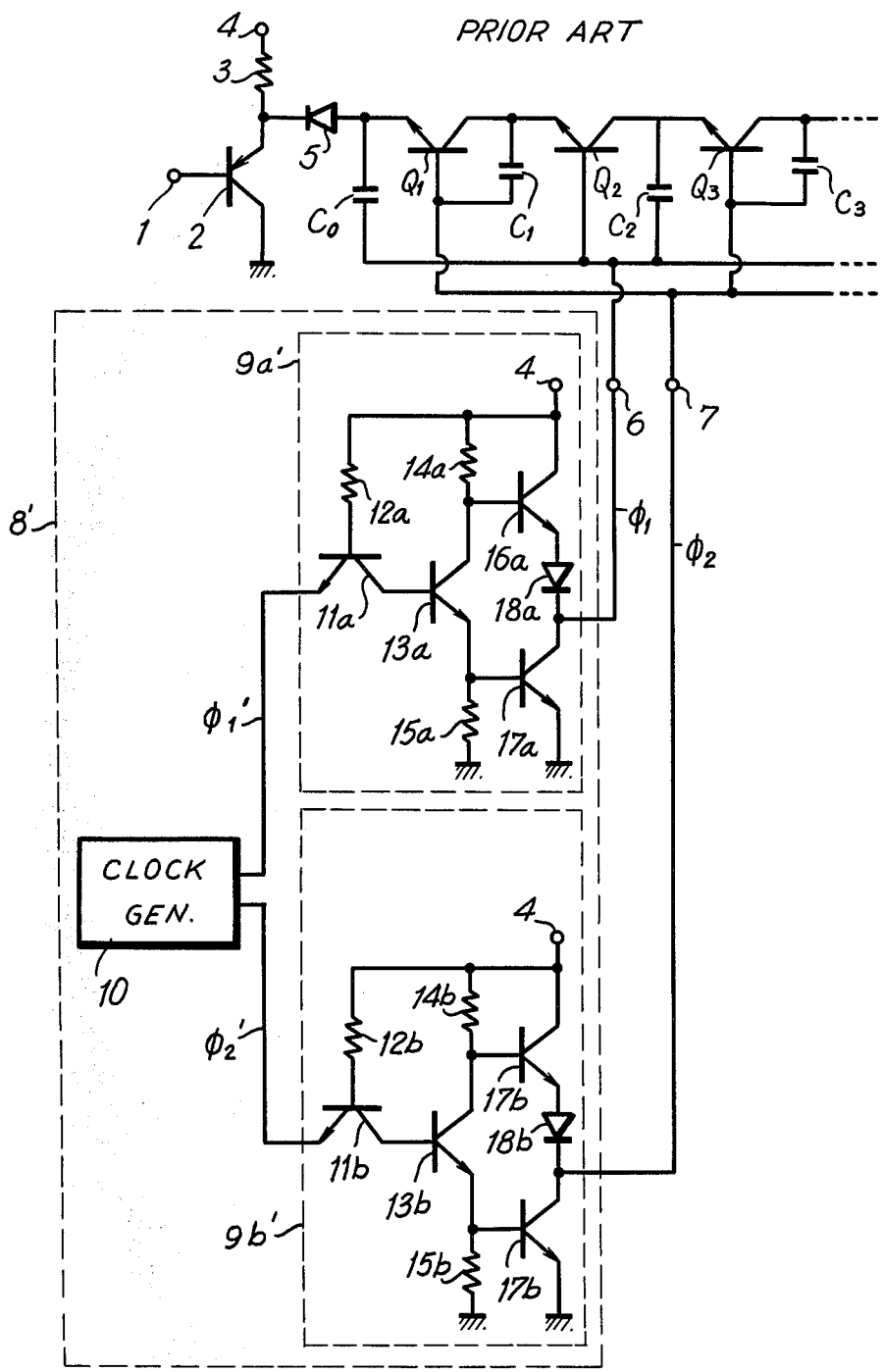
FIG. 1 is a schematic diagram of a bucket brigade device (BBD) having clocking signal drive circuits of the type used in the prior art.

Referring in detail to FIG. 1, a CTD of the bucket brigade type is there shown which has a prior art clocking signal drive circuit. In FIG. 1, an input terminal 1 is connected to the base of a PNP transistor 2 which has its collector grounded and its emitter connected to a power supply terminal 4 through a resistor 3. The emitter of transistor 2 is also connected to one end or plate of a capacitor $C_0$ through a diode 5, and the other end or plate of this capacitor $C_0$, that is, its clocking end, is connected to a clock terminal 6. The non-clocking, or more positive end of a capacitor $C_0$ is connected to the emitter of an NPN transistor $Q_1$, and the collector of transistor $Q_1$ is connected to the emitter of a succeeding NPN transistor $Q_2$. Similarly, the collectors and emitters of succeeding transistors $Q_3$, $Q_4$, ... are connected serially. The current gains $\beta$ of all the transistors are made to be the same, which is fairly easy to do if all the transistors are fabricated on a monolithic integrated circuit. The capacitors $C_1$, $C_2$, $C_3$, ... are all connected between the bases and collectors of the transistors $Q_1$, $Q_2$, $Q_3$, ..., respectively. The capacitances of the capacitors are all assumed to be the same as the capacitance C of capacitor $C_0$. The bases of odd numbered transistors $Q_1$, $Q_3$, ... are connected to a clocking signal input terminal 7 and the bases of even numbered transistors $Q_2$, $Q_4$, ... are connected to the clocking signal input terminal 6. Clocking signals $\phi_1$ and $\phi_2$ (FIGS. 2A and 2B) are supplied to terminals 6 and 7, respectively. These clocking signals are opposite in phase to each other, have a 50% duty cycle, and take the voltage $V_{DC}$ at their lower level and the voltage $V_{DC}+V_P$ at their higher level. The relationship between the voltages $V_{DC}$ and $V_P$ and the power supply voltage $V_{CC}$ supplied to the power supply terminal 4 is as follows:

$$V_{CC} > V_{DC} + 2V_P \qquad (1)$$

An input signal $V_S$ is supplied to input terminal 1 and has a dynamic range as follows:

$$V_{DC} + V_P \leq V_S \leq V_{DC} + 2V_P \qquad (2)$$

The input signal $V_S$ can be considered to be separated into a DC component $V_{SDC}$ and an AC component $V_{SAC}$. In other words, the input signal $V_S$ swings around the DC level $V_{SDC}$ as its AC center voltage.

Figure 2C:
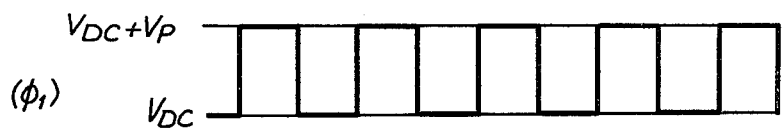
Figure 2C:
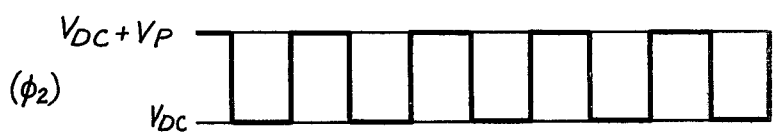
Figure 2C:
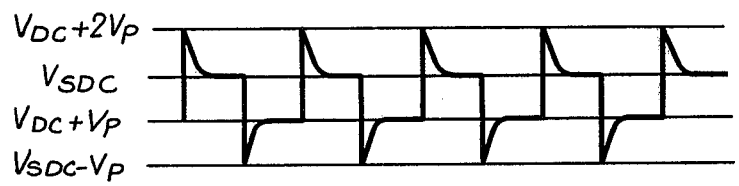

In the initial, or quiescent, state of the bucket brigade device (BBD) of FIG. 1, when the input signal $V_S$ is equal to $V_{SDC}$, the more positive end of each of even capacitors $C_0$, $C_2$, $C_4$, ..., that is, the end opposite to the end of each of the capacitors to which the clocking signal $\phi_1$ is supplied, take the voltages shown in FIG. 2C. This voltage very quickly rises up to a level $V_{DC}+2V_P$ and then more slowly falls to the level $V_{SDC}$ during the time that the clocking signal $\phi_1$ (FIG. 2A) has the voltage $V_{DC}+V_P$ and then it very quickly falls down to the voltage level $V_{SDC}-V_P$ and more slowly rises up to the voltage level $V_{DC}+V_P$ during the period that the clock signal $\phi_1$ has the voltage of $V_{DC}$.

Figure 2D:
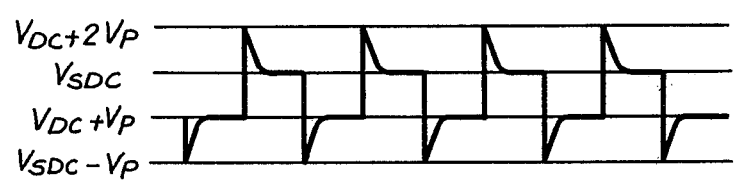

The more positive end of each of the odd numbered capacitors $C_1$, $C_3$, ... takes the voltage shown in FIG. 2D, which is equal to, but 180° out of phase with, the waveform shown in FIG. 2C. The shape of the waveform shown in each of FIGS. 2C and 2D can be explained briefly as follows: During the period when the clock signal $\phi_2$ is high, the transistor $Q_1$ conducts current to the capacitor $C_0$ until the voltage at the more positive end of that capacitor substantially equals the voltage $V_{DC}+V_P$ applied to the base of the transistor $Q_1$, turning transistor $Q_1$ off. At this time, the voltage across capacitor $C_0$ is equal to $V_P$, which is the difference between the voltage supplied to the base of transistor $Q_1$ and the voltage supplied to the clocking end of capacitor $C_0$. When the values of the clocking signals change so that the clocking signal $\phi_1$ rises to the level $V_{DC}+V_P$, the voltage at the more positive end of capacitor $C_0$ quickly rises up, as is shown in FIG. 2C, to the level of $V_{DC}+2V_P$, since the voltage across capacitor $C_0$ is equal to $V_P$. However, as is shown in the FIG. 2C, voltage discharges from capacitor $C_0$ through diode 5 and down to ground through the emitter-collector path of transistor 2 until the voltage level at the more positive end of capacitor $C_0$ equals $V_{SDC}$. Then, when clocking signal $\phi_1$ drops by the voltage $V_P$ to its low value, the voltage at the more positive end of capacitor $C_0$ drops by an equivalent amount to the voltage $V_{SDC}-V_P$. However, during this period, clock signal $\phi_2$ is high, causing transistor $Q_1$ to conduct current from capacitor $C_1$ to capacitor $C_0$. As was stated previously, this conduction of charge continues until the voltage at the more positive end of capacitor $C_0$ is raised to the level $V_{DC}+V_P$ which is applied to the base of transistor $Q_1$, at which point the charge across capacitor $C_0$ equals $V_P$. The amount of charge which flows from capacitor $C_1$ to capacitor $C_0$ to raise the voltage at the more positive end of capacitor $C_0$ from $V_{SDC}-V_P$ to $V_{DC}+V_P$ is as follows:

$$[(V_{DC}+V_P)-(V_{SDC}-V_P)]\times C=[(V_{DC}+2V_P)-V_{SDC}]C \quad (3)$$

As can be seen from this equation the amount of current which flows from capacitor $C_1$ to capacitor $C_0$ during this period is equal to the amount of current required to lower the voltage at the more positive end of capacitor $C_1$ from $V_{DC}+2V_P$ to the voltage level $V_{SDC}$ as is shown in FIG. 2D. After repeated clocking cycles the voltages on capacitors $C_0$ and $C_1$ are transferred to all of the capacitors of the BBD, so that at the end of the period that any one of clocking signals is high every other capacitor has a voltage across it equal to $V_P$ and each of the remaining capacitors has a voltage across it equal to $V_{SDC}-(V_{DC}+V_P)$.

If an input signal $V_S$ is supplied to the input terminal 1, where $V_S$ is equal to $V_{SDC}+V_{SAC}$, during the period that $\phi_1$ is high, the voltage at the more positive end of capacitor $C_0$, after rapidly rising up to $V_{DC}+2V_P$, will fall down to the voltage $V_S$. This means that the capacitor $C_0$, which initially stores the charge $V_P \times C$ during the high level of the clocking signal $\phi_1$, discharges until it stores a charge equal to the voltage difference between its two ends times its capacitance, or $[V_S-(V_{DC}+V_P)]C$. During this period, the transistor $Q_1$ is non-conductive so the charges stored on capacitors $C_1$, $C_2$, ... are unchanged by the voltage $V_S$.

During the succeeding period when the clocking signal $\phi_2$ has the voltage $V_{DC}+V_P$ and the voltage of the clocking signal $\phi_1$ has the voltage $V_{DC}$, the voltage at the more positive end of capacitor $C_0$ rapidly falls by the same amount as the voltage of the clocking signal $\phi_1$ to the level $V_S-V_P$. During this period the transistor $Q_1$ is turned on by the high level of clock signal $\phi_2$ so that it conducts charge from capacitor $C_1$ to capacitor $C_0$ until the voltage at the more positive end of capacitor $C_0$ rises to the base voltage $V_{DC}+V_P$, of the transistor $Q_1$, minus a small offset voltage $V_{be}$ of the base-emitter junction of transistor $Q_1$. During this period the transistor $Q_1$ operates in its active region, and the charging of capacitor $C_0$ is caused by current flowing through from the clocking signal input terminal 7 through the capacitor $C_1$ and the collector-emitter path of transistor $Q_1$ to the capacitor $C_0$. It should also be noted that during this period a small amount of current flows from terminal 7 through the base-emitter junction of transistor $Q_1$ to capacitor $C_0$.

Disregarding the offset voltage $V_{be}$ of transistor $Q_1$, the voltage at the more positive end of capacitor $C_0$ changes during the high period of the clocking signal $\phi_2$ from its above-mentioned initial level $V_S-V_P$ to a final level of $V_{DC}+V_P$, which is equal to the base voltage of transistor $Q_1$. Thus the total charge injected into capacitor $C_0$ during this period is expressed as follows:

$$[(V_{DC}+V_P)-(V_S-V_P)]C=(V_{DC}+2V_P-V_S)C \quad (4)$$

An amount equal to $\beta/(1+\beta)$ of this total charge is supplied from the capacitor $C_1$ and an amount equal to $1/(1+\beta)$ of this total charge is supplied by the base current through the transistor $Q_1$. Initially during the high period of the clocking signal $\phi_2$ the charge $V_P \times C$ is stored upon the capacitor $C_1$, owing to the operation of the transistor $Q_2$ during the previous clocking period when the clocking signal $\phi_1$ was high. Since the capacitor $C_1$ discharges by an amount equal to $\beta/(1+\beta)$ $(V_{DC}+2V_P-V_S)C$ during the period that $\phi_2$ is high, the final charge of the capacitor $C_1$ during this period is expressed as follows:

$$V_P \cdot C - \frac{\beta}{1+\beta}(V_{DC}+2V_P-V_S)C = \quad (5)$$

$$\left\{ \frac{\beta}{1+\beta}[V_S-(V_{DC}+V_P)] + \frac{1}{1+\beta}V_P \right\}C$$

The above equation means that the voltage level $V_S-(V_{DC}+V_P)$ across the capacitor $C_0$ during the end of the period when the clocking signal $\phi_1$ is high is transferred to the capacitor $C_1$ by the end of the next clocking period when the clocking signal $\phi_2$ is high. But the equation shows that this voltage level is transferred from capacitor $C_0$ to capacitor $C_1$ with a transfer gain of $\beta/(1+\beta)$ and with a DC level shift of $1/(1+\beta)$ $V_P$.

Usually the current gain $\beta$ of the transistors of a bucket brigade device is large enough compared with unity so that the base current can be neglected in such a transfer from one stage to the next, so that the final charge on capacitor $C_1$ can be expressed as follows:

$$V_P \cdot C - (V_{DC}+2V_P-V_S)C = [V_S-(V_{DC}+V_P)]C \quad (6)$$

This equation means that the signal voltage across the capacitor $C_0$ is transferred to the capacitor $C_1$.

During this period when the clocking signal $\phi_2$ has the voltage $V_{DC}+V_P$, the transistor $Q_2$ is non-conductive and the introduction of the voltage $V_S$ different from the voltage $V_{SDC}$ as of yet has no effect upon the capacitors $C_2$, $C_3$, ....

During the next clocking period when the clocking signal $\phi_1$ is high, the voltage at the more positive end of the capacitor $C_1$ initially drops to $V_S-V_P$ and then gradually rises up to the level of the base voltage of transistor $Q_2$, which is equal to $V_{DC}+V_P$. During this period the total charge injected into the capacitor $C_1$ can be expressed as follows:

$$\left\{(V_{DC}+V_P) - \frac{\beta}{1+\beta}[V_S-(V_{DC}+V_P)] + \frac{1}{1+\beta}V_P\right\}C \quad (7)$$

An amount equal to $\beta/(1+\beta)$ times this total charge is supplied from the capacitor $C_2$ and the remainder of this total charge is supplied by the base emitter current of transistor $Q_2$. The initial charge stored on the capacitor $C_2$ during this period in which the clocking signal $\phi_1$ is high is equal to $V_P \cdot C$ and the final charge on the capacitor $C_2$ during this period is as follows:

$$V_P \cdot C - \frac{\beta}{1+\beta}\left\{(V_{DC} + V_P) - \left[\frac{\beta}{1+\beta}(V_S - (V_{DC} + V_P)) + \frac{1}{1+\beta}V_P\right]\right\} C = \qquad (8)$$

$$\left\{\left(\frac{\beta}{1+\beta}\right)^2 [V_S - (V_{DC} + V_P)] + \frac{1}{1+\beta} + \frac{\beta}{1+\beta} \cdot \frac{1}{1+\beta} V_P\right\} C$$

By similar reasoning at the end of the next clocking period when the clocking signal $\phi_2$ is high, the final charge on the capacitor $C_3$ will be as follows:

$$V_P \cdot C - \frac{\beta}{1+\beta}\left\{(V_{DC} + V_P) - \left[\left(\frac{\beta}{1+\beta}\right)^2 (V_S - V_{DC} + V_P)) + \frac{1}{1+\beta}V_P + \right.\right. \qquad (9)$$

$$\left.\left. \frac{1}{1+\beta}V_P + \frac{\beta}{1+\beta} \cdot \frac{1}{1+\beta} V_P \right]\right\} C =$$

$$\left\{\left(\frac{\beta}{1+\beta}\right)^3 [V_S - (V_{DC} + V_P)] + \frac{V_P}{1+\beta} + \frac{\beta}{1+\beta} \cdot \frac{1}{1+\beta} V_P + \frac{1}{1+\beta} \cdot \left(\frac{\beta}{1+\beta}\right)^2 V_P\right\} C$$

Thus it can be seen that the final charge across a capacitor $C_m$ connected across the transistor $Q_m$, where m is an integer, at the end of a clocking period when the clocking signal supplied to the base of transistor $Q_m$ and the clocking end of capacitor $C_m$ is high will be as follows:

$$\left\{\left(\frac{\beta}{1+\beta}\right)^m [V_S - (V_{DC} + V_P)] + \frac{1}{1+\beta}\left[1 + \frac{\beta}{1+\beta} + \left(\frac{\beta}{1+\beta}\right)^2 + \ldots \left(\frac{\beta}{1+\beta}\right)^{m-1}\right] V_P\right\} C \qquad (10)$$

by substituting $\alpha$ for $\beta/(1+\beta)$ the above equation can be rewritten as follows:

$$\{\alpha^m[V_S - (V_{DC} + V_P)] + (1 - \alpha)[1 + \alpha + \alpha^2 + \qquad (11)$$

$$\ldots \alpha^{m-1}] V_P\}C = \{\alpha^m [V_S - (V_{DC} + V_P)] +$$

$$(1 - \alpha^m) V_P\}C = \{\alpha^m [V_{SAC} - (V_{DC} + V_P)] +$$

$$\alpha^m \cdot V_{SDC} + (1 - \alpha^m) V_P\}C$$

From the above equation it can be seen that if the base current of all the transistors is disregarded and, thus if $\alpha$ is considered to be one, the final charge of the capacitor $C_m$ will be equal to $[V_S - (V_{DC} + V_P)]C$, which is the value of the charge originally applied to capacitor $C_0$ and which is the desired signal at the capacitor $C_m$. However, due to the effect of the base currents in the transistors $Q_1$ through $Q_m$, the actual charge transferred to capacitor $C_m$ differs from that originally applied to capacitor $C_0$ by a DC level shift equal to $(V_{DC} + 2V_P - V_S)$ $(1 - \alpha^m)$ and is multiplied by a signal gain equal to $\alpha^m$, which gain decreases the strength of the signal since $\alpha$ is a positive number less than one.

Even with the above-mentioned DC level shift and signal gain, the BBD disclosed in FIG. 1 is capable of sampling its input signal $V_S$ once during each cycle of its clocking signal $\phi_1$ and of transferring that sampled value to a successive capacitor each time its clocking signals change state, or at a rate equal to twice the frequency of its clocking signal. Thus, the BBD could be used as an analog delay circuit capable of transferring frequencies equal to approximately ½ its clocking frequency, and the delay time of such a circuit will depend upon the frequency of the clocking signal and the number of capacitors which separate the output from the input.

FIG. 1 illustrates a clocking signal drive circuit 8' of the type used in the prior art for supplying clocking signals $\phi_1$ and $\phi_2$ to a BBD. Clock driver circuit 8' is shown as being comprised of a $\phi_1$ clock driver 9a' and a $\phi_2$ clock driver 9b', which are identical to each other except for the fact that the driver 9a' receives as its input a clocking control signal $\phi_1'$ and provides as its output the clocking signal $\phi_1$, whereas the drive circuit 9b' receives as its input the clocking control signal $\phi_2'$ and provides as its output the clocking signal $\phi_2$. The components of the drive circuit 9b' are numbered in a corresponding manner to those of the drive circuit 9a'. Because of the similarity of the two drive circuits, only the connections and operation of the drive circuit 9a' will be explained.

The clocking signal generator 10 provides clocking control signals $\phi_1'$ and $\phi_2'$ which correspond to the clocking signals $\phi_1$ and $\phi_2$, respectively. The output $\phi_1'$ of the clocking signal generator 10 is connected to the emitter of an NPN transistor 11a, the base of transistor 11a is connected to a power supply terminal 4 through resistor 12a, and the collector of transistor 11a is connected to the base of the NPN transistor 13a. The collector of the transistor 13a is connected to the power supply terminal 4 through resistor 14a, and the emitter of transistor 13a is grounded through the resistor 15a. The collector of transistor 13a is also connected to the base of transistor 16a and the emitter of transistor 13a is connected to the base of transistor 17a. The collector of transistor 16a is directly connected to the power supply terminal 4, and the emitter of transistor 16a is connected to the collector of transistor 17a through the diode 18a, which is oriented to conduct positive charge from transistor 16a to transistor 17a. The emitter of transistor 17a is grounded and the collector of transistor 17a is connected to the clocking signal input terminal 6.

The operation of the drive circuit 9a' is as follows: When the output signal of the clocking signal generator 10, $\phi_1'$ is at its low voltage level, the transistor 11a is conductive and the base voltage of transistors 13a is thus pulled to a low level, so that transistor 13a is turned off and so that its collector is thus pulled high through resistor 14a until it reaches a voltage level close to that of terminal 4, turning transistor 16a on. At the same time the emitter of transistor 13a is pulled low by the resistor 15a, so that it attains a voltage close to that of ground. As a result, the transistor 17a is turned off and the output voltage at the collector of transistor 17a is driven high by the output of transistor 16a and acquires a voltage nearly equal to $V_{CC} - 2V_{be}$, where $V_{be}$ is the offset voltage of the diode 18a and of the base-emitter junction of transistor 16a. Here the transistor 16a operates in the active region, because the voltage drop across resistor 14a, however small, will prevent the base collector junction from being forward biased.

When the clocking control signal $\phi_1'$ switches to its high voltage level, the base-emitter junction of transistor 11a is reversed biased and that transistor is made non-conductive. As a result current flows from the positive voltage source 4, through resistor 12a and the base-collector junction of transistor 11a, to the base of transistor 13a, so as to raise the base voltage of transistor 13a and to make it conductive. As a result the collector voltage of transistor 13a drops and the emitter voltage of that transistor rises. The driver circuit 9a' is designed so that when transistor 13a is turned on, its collector voltage will be higher than its emitter voltage by $V_{be}$ so that transistor 13a will be operated in the active region. In response to the rise of the emitter voltage of the transistor 13a, the transistor 17a, which is connected to that emitter, is turned on. During this time, the collector voltage of transistor 17a is lower than the collector voltage of transistor 13a by $2V_{be}$, which is the voltage drop across the base-emitter junction of transistor 16a and across diode 18a. The base of transistor 17a, however, is lower than the collector voltage of transistor 13a only by $V_{be}$, the above-mentioned voltage drop across the base-collector junction of transistor 13a. Thus the base voltage of the transistor 17a is higher than its collector voltage, and the base-collector junction of the transistor 17a is therefore forward biased, which causes the transistor to be saturated. As a result, the collector voltage of transistor 17a and the clock signal $\phi_1$ produced at its collector become substantially equal to ground.

As can be seen from the operation of the circuit 9a', the phase of the clocking signal $\phi_1$ is opposite to that of the clocking control signal $\phi_1'$. Similarly the clocking signal $\phi_2$ is opposite in phase to the clocking control signal $\phi_2'$, and these two clocking control signals $\phi_1'$ and $\phi_2'$ are 180° out of phase with each other so that the clocking signals $\phi_1$ and $\phi_2$ achieve high and low levels in alternation with each other.

In the embodiment of the driver circuit 9a' and 9b' shown in FIG. 1, the level of the clocking signal $\phi_1$ and $\phi_2$ alternates between ground and a certain positive voltage $V_P$, which is different than the clocking signal shown in FIGS. 2A and 2B, which alternate between the voltage $V_{DC}$ and $V_{DC} + V_P$. In order to cause the clocking signals $\phi_1$ and $\phi_2$ produced by drive circuits 9a' and 9b' to have the voltages shown in FIGS. 2A and 2B, the emitters of transistors 17a and 17b should be connected to a voltage source having the voltage $V_{DC}$ and the power supply terminal 4 should be supplied with a voltage sufficiently high so that the voltage at the collector of transistor 17a and 17b will be equal to $V_{DC} + V_P$ when transistors 16a and 16b, respectively conduct.

The prior art clocking signal drive circuit 8' is capable of clocking a CTD such as the BBD shown in FIG. 1, but such a clocking signal drive circuit has several disadvantages. First, the transistors 17a and 17b operate in the saturation region, and thus the time it takes for these transistors to change from their ON to their OFF state is greatly increased. This is because during the period that the transistor 17a or 17b is saturated an excess of minority carriers are stored in its base, so that even after the base voltage of the transistor 17a or 17b is brought low, the transistor will continue to conduct until the abnormally high level of minority carriers has been removed. Thus the fact that the transistors 17a and 17b are operated in the saturation region decreases the speed at which the clocking signals generated in drive circuits 9a' and 9b' can be switched from a low to a high level, and thus decreases the maximum frequency which such clocking signal can achieve.

A second disadvantage of the drive circuits 9a' and 9b' is that they require a relatively large number of semi-conductor devices, which fact increases the cost, space and current requirements of the CTD in which such drive circuits are used.

Further disadvantage of the drive circuits 9a' and 9b' is that they cannot be used to determine the charge level on one or more of the capacitive storage elements of the CTD to which they are connected. This is unfortunate since the prior art method of deriving an output from a CTD is less than totally satisfactory, as will be explained with reference to FIGS. 3 and 4.

Figure 3:
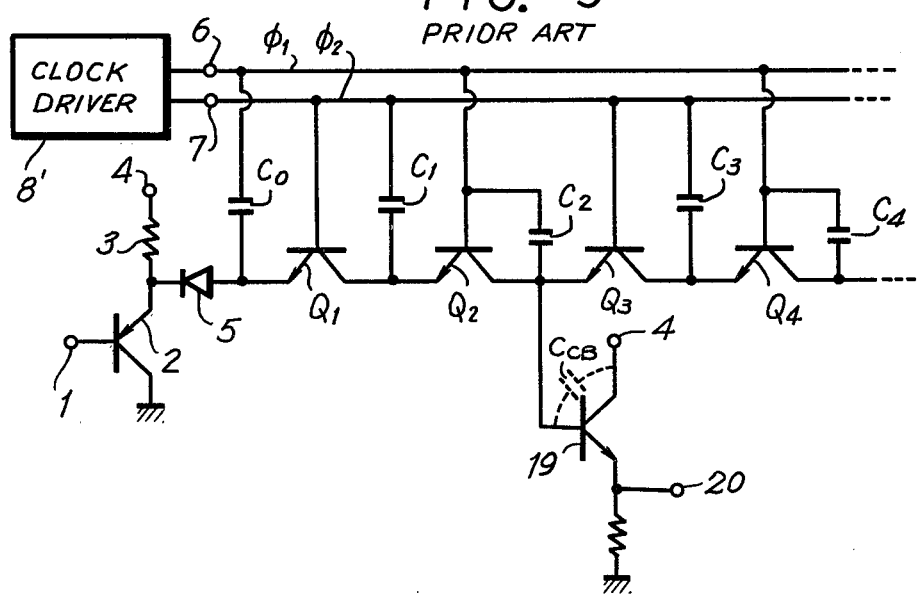
FIG. 3 is a schematic diagram of a BBD having an output circuit used in the prior art to determine the charge level upon a given capacitor in the BBD.

The circuitry of FIG. 3 is identical to that of FIG. 1 except that the clocking signal drive circuit 8' is shown in block form and that an emitter follower transistor 19 is supplied with its base connected to the more positive end of capacitor $C_2$ for the purpose of deriving an output from that capacitor. The collector of transistor 19 is connected to a positive power supply 4, and its emitter is connected through a resistor to ground. The emitter of transistor 19 emitter is also connected to an output terminal 20 at which a voltage equal to that supplied to the base of transistor 19 minus the voltage $V_{be}$ of the transistor 19 will be derived. Usually the output derived from terminal 20 will be supplied to a sampling and hold circuit (not shown) so that output voltage can be more easily measured.

In the circuitry shown in FIG. 3 the output signal derived from capacitor $C_2$ will be delayed relative to the input signal supplied to terminal 1 by one complete clock cycle, that is $\tau$ (where $\tau$ equals $1/f_C$ and where $f_C$ is the clocking signal frequency). It should be obvious that greater delays could be achieved by connecting the emitter follower transistor 19 to capacitors further removed from the input capacitor $C_0$.

Unfortunately the method of deriving an output signal from a CTD by connecting an emitter follower transistor to one of its capacitive electrodes has several major defects. First of all, the use of such an emitter follower transistor introduces a stray capacitance $C_{CB}$, which is the capacitance between the collector and the base of transistor 19. This stray capacitance $C_{CB}$ has the same effect as if capacitor $C_2$ had the capacitance $C+C_{CB}$ instead of the capacitance $C$, which all of the other capacitors $C_0$, $C_1$, $C_3$, ... have. As a result, the uniform relationship which exists between voltage and charge in all of the other capacitors $C_0$, $C_1$, $C_3$ ... fails to exist in capacitor $C_2$. Thus at the end of the period when the clocking signal $\phi_1$ is high and charge is transferred from capacitor $C_2$ to capacitor $C_1$, the final voltage across capacitor $C_2$ will be different than the voltage which was previously across capacitor $C_1$, which means that an error is introduced into the voltage signal $V_S$ transferred between the capacitors $C_1$ and $C_2$.

A further disadvantage of using the emitter follower transistor 19 is that its base current causes charge to be withdrawn from capacitor $C_2$, which further decreases the accuracy of the voltage read from that capacitor, and which introduces an error into the voltage signal on capacitor $C_2$ that will be transferred to subsequent stages of the CTD during successive clocking periods.

A still further disadvantage of emitter follower transistors relates to the complexity of using them as output devices in CTDs designed to function as filter circuits. As is well-known in the art a charge transfer device can be made to operate as a transverse filter circuit by sampling the voltage levels at a plurality of its capacitive storage elements and by weighing these sampled voltage levels and adding them together. This has the effect of determining whether the input signal has varied in a desired manner as a function of time.

Figure 4:
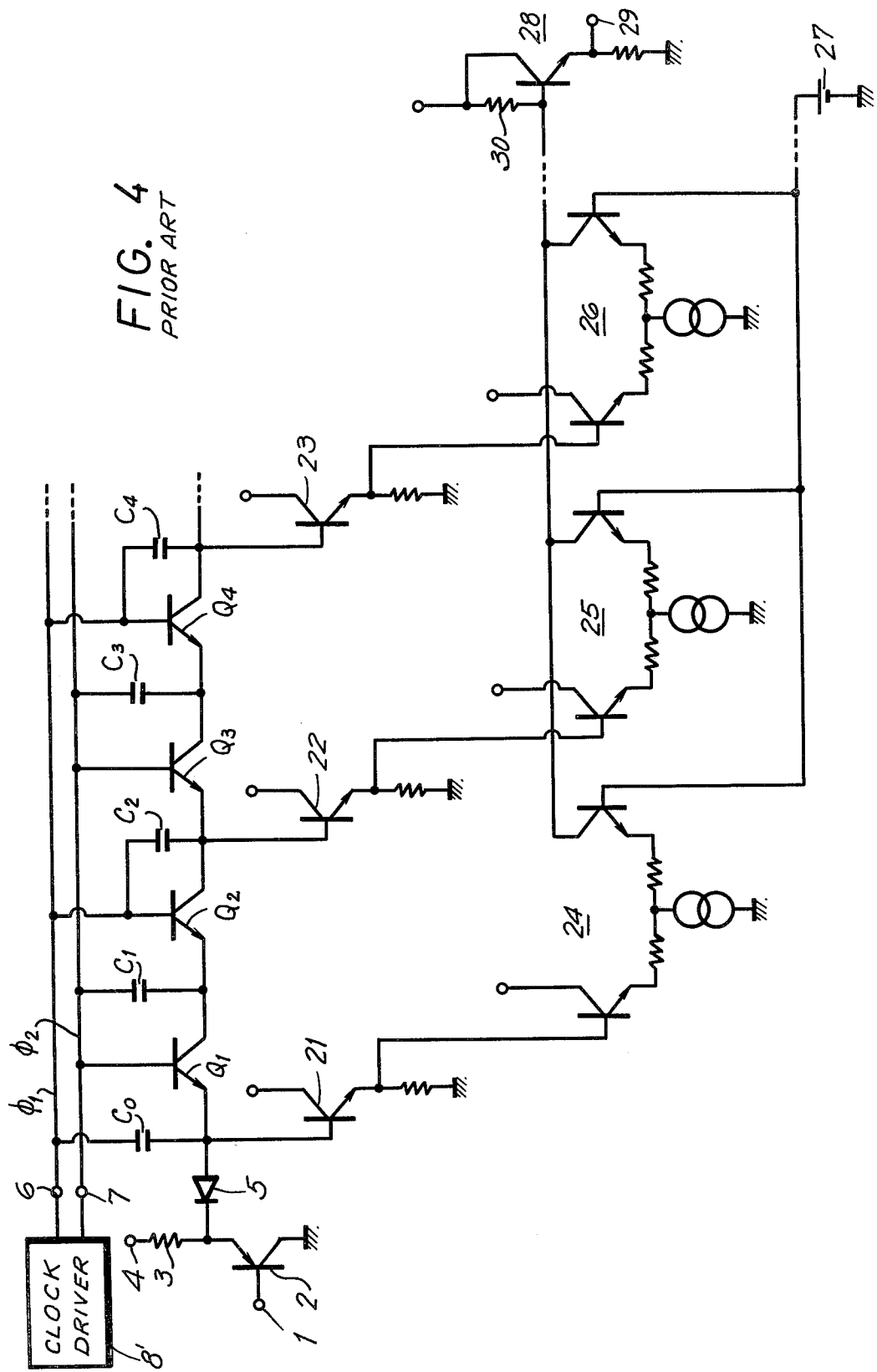
FIG. 4 is a schematic diagram of a BBD connected to operate as a filter circuit, and showing the output circuit used with such a filter circuit according to the prior art.

FIG. 4 discloses a transverse filter comprised of a BBD and a prior art output circuit. The circuitry of FIG. 4 is identical to that of FIG. 3 with the exception that each of its even numbered capacitors $C_0$, $C_2$, $C_4$, ... has its more positive end connected to the base of an emitter follower transistor, 21,22,23, ..., respectively, each of which transistor is connected to function in a manner similar to that of transistor 19 in FIG. 3. The emitter of each of these emitter follower transistors is connected to a separate differential amplifier, 24,25,26, ... Another input of each of the differential amplifiers is connected to a fixed voltage source 27, and the output terminal of each of these differential amplifiers is connected to the base of a single emitter follower transistor 28, the emitter of which transistor 28 is connected to an output terminal 29. In the circuit shown in FIG. 4 the output voltage signals at the more positive end of each of the even numbered capacitors is obtained at the emitter of its respective emitter follower transistor, and is used to create a proportional current flow through its respective differential amplifier. Each of the differential amplifiers is designed to have a predetermined multiplying ratio which causes the current flow through the resistor 30, and thus the voltage supplied to the base of transistor 28, to be equal to a weighted sum of each of the voltages at the more positive end of each of the even numbered capacitors.

The defect of this prior art output circuit is clearly seen from FIG. 4. It requires a large number of devices, which in turn, increases the cost, space and power requirements of any transverse filter with which it is used. Furthermore such an output device requires the current gain in each of the differential amplifiers 24,25,26 ... to be accurately set in order to function properly, which often proves a difficult task. In addition each of the emitter follower transistors 21,22,23, ... has all of the disadvantages discussed above in regard to transistor 19 of FIG. 3.

Figure 5:
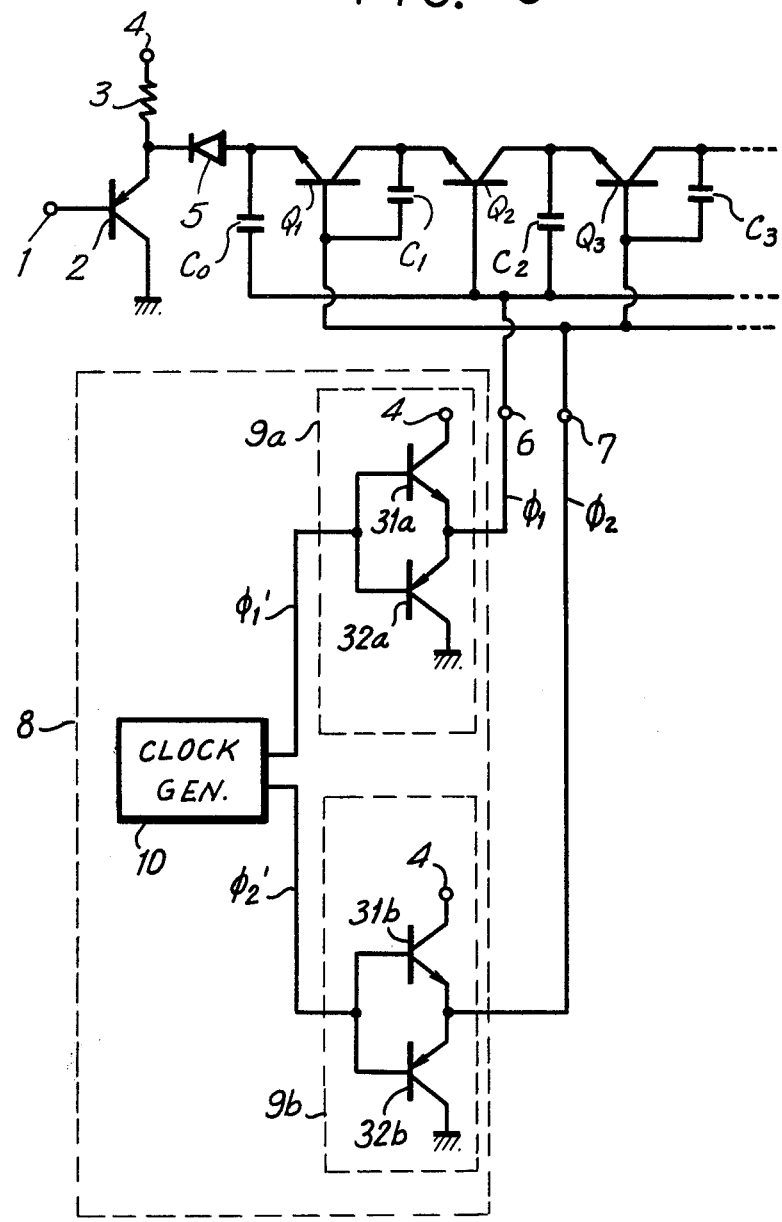
FIGS. 5, 6 and 7 are schematic diagrams of charge transfer devices (CTDs) using clocking signal drive circuits according to respective embodiments of the present invention.

According to the present invention a clocking signal drive circuit is provided which overcomes many of the problems associated with both clocking signal drive circuits and CTD output circuits of the prior art. FIG. 5 shows a clocking signal drive circuit 8 according to the present invention. It is comprised of two separate drive circuits 9a and 9b, which are identical except for the fact that drive circuit 9a receives as an input the clocking control signal $\phi_1'$ from the clocking signal generator 10 and produces as an output the clocking signal $\phi_1$, whereas the drive circuit 9b receives the clocking control signal $\phi_2'$ from the clocking signal generator 10 and provides as an output the clocking signal $\phi_2$. The components of the drive circuit 9b are labeled in a corresponding manner to those of the drive circuit 9a. Because of the similarity of the two drive circuits, only the connections and operation of drive circuit 9a will be explained.

Drive circuit 9a is comprised of two complementary transistors, an NPN transistor 31a and a PNP transistor 32a. The bases of transistors 31a and 32a are connected together and to the output of the clocking signal generator 10 on which the clocking signal $\phi_1'$ is provided. The collector of the NPN transistor 31a is connected to a power supply terminal 4 and the collector of the PNP transistor 32a is grounded. The emitters of both transistors 31a and 32a are connected to the clocking signal input terminal 6 to which they supply an an output the clocking signal $\phi_1$.

The operation of the drive circuit 9a is as follows: When the clocking control signal $\phi_1'$ is low, transistor 31a is non-conductive and transistor 32a is conductive, and thus the clocking signal $\phi_1$ supplied to the terminal 6 acquires a low level. When the clocking control signal $\phi_1$ is switched to its high level, the transistor 31a is made conductive and the transistor 32a is made non-conductive, and thus the clocking control signal $\phi_1$ acquires a high voltage level. Similarly the clocking signal $\phi_2$ produced by drive circuit 9b is high when the clocking control signal $\phi_2'$ is high and it is low when that clocking control signal is low. The clocking control signals $\phi_1'$ and $\phi_2'$ are oppositely phased, with only one having a high level at a time, so that the clocking signals $\phi_1$ and $\phi_2$ are similarly opposite in phase with only one having a high level at a time.

In order to cause the voltage levels of the clocking signals $\phi_1$ and $\phi_2$ to vary between the levels $V_{DC}$ and $V_{DC}+V_P$, the levels of the control signals $\phi_1'$ and $\phi_2'$ are selected to vary between a high level voltage of $V_{DC}+V_P+V_{be}$ and a low level of $V_{DC}-V_{be}$, where $V_{be}$ is the offset voltage of the transistors 31a,31b,32a and 32b.

By selecting the high level voltage of the clocking control signals to be $V_{DC}+V_P+V_{be}$, which is less than the voltage $V_{CC}$ at the power supply terminal 4, and by selecting the low level voltage of the clocking control signals to be $V_{DC}-V_{be}$, which is higher than ground, the transistors of the drive circuits 9a and 9b will always operate in the active region and will be prevented from saturating because their base-collector junctions will always be reversed biased. As a result the speed with which these transistors can turn off is much higher than if they were operated in the saturation region. Therefore the switching speed of the clocking signal drive circuit 8 shown in FIG. 5 is very fast, which allows the clocking frequency of the charge transfer device to be high. For example, with a clocking signal drive circuit such as is shown in FIG. 5 it is possible to cause a BBD to transmit signals of a video frequency.

The clocking signal drive circuit 8 also has the advantage that it has relatively few parts, which decreases the cost, space and power requirements of the CTD device with which it is used.

Figure 6:
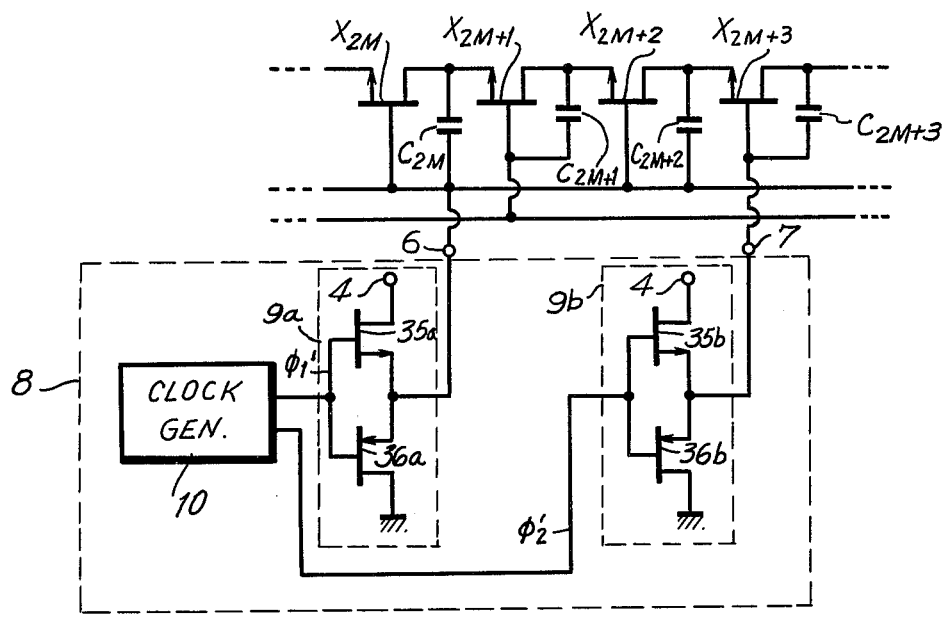

FIG. 6 shows a portion of a BBD which is very similar to the BBD shown in FIG. 5, except that it uses field effect transistors (FETs) instead of bi-polar transistors. The BBD of FIG. 6 is formed of a series of FETs, $X_{2m}$ to $X_{2m+3}$ of which are shown, where m is an integer, each with their source connected to the drain of the preceding FET. A capacitor is connected between the gate and the drain of each FET and the gate of every other FET is connected together, with the gates of the even numbered FETs being connected to the clocking signal input terminal 6 and the gates of the odd numbered FETs being connected to the clocking signal input terminal 7. A clocking signal drive circuit 8 is provided for this BBD which is identical to that shown in FIG. 5, except that it is comprised of complementary MOSFETs of the enhancement type rather than of complimentary bi-polar transistors.

The clocking control signal $\phi_1'$ produced by the clocking signal generator 10 is connected to a connection point of the gates of the complimentary FETs 35a and 36a, and the sources of these two FETs are connected together and to the clocking signal input terminal 6. A drain of the N channel FET 35a is connected to a power supply terminal 4 and a drain of the P channel FET 36a is grounded. The complementary transistors 35b and 36b are connected in the same manner as transistors 35a and 36a except that their gates receive the clocking control signal $\phi_2'$ from the clocking signal generator 10 and their sources are connected to the clocking signal input terminal 7.

The two drive circuits 9a and 9b comprised of complementary FETs 35a and 36a and 35b and 36b, respectively, operate in essentially the same manner as the drive circuits 9a and 9b of FIG. 5. Assuming that the offset voltage between the gate and the source of the N channel FETs 35a and 35b is $V_{GS}$ and that the offset voltage between the gate and the source of the P channel FETs 36a and 36b is $V_{GS}'$, the high and low voltage levels of the clocking control signals $\phi_1'$ and $\phi_2'$ should be selected to be equal to $V_{DC}-V_{GS}'$ and $V_{DC}+V_P+D_{GS}$, respectively.

Figure 7:
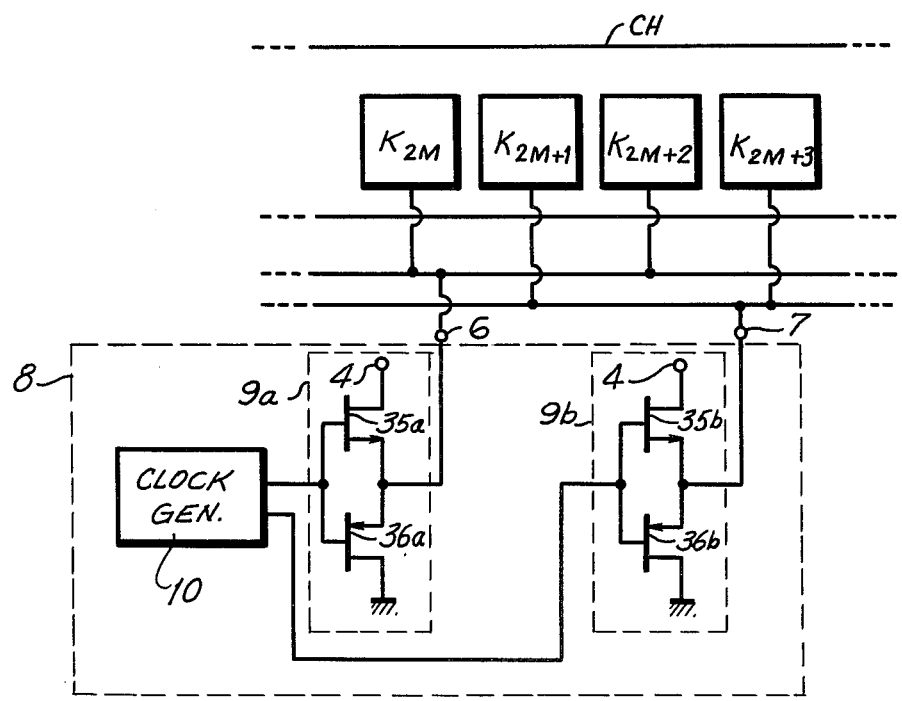

FIG. 7 shows an FET clocking signal drive circuit 8 identical to that disclosed in FIG. 6 applied to a charge coupled device (CCD). As is well-known in the art, a CCD is comprised of a series of electrodes, $K_{2m}$ through $K_{2m+3}$ of which are shown in FIG. 7, where m is a positive integer. Each of these electrodes is capable of capacitively holding an opposite charge in a common channel CH of semi-conductor material. By shifting the relative voltage on adjacent electrodes, it is possible to cause charge originally attracted by one of the electrodes to be transferred to its adjacent electrode, thus allowing a signal to be shifted along the CCD in a manner somewhat analogous to the transfer of charge through a BBD. In FIG. 7 alternate electrodes of the CCD are connected together, with the even numbered electrodes being connected to clocking signal input terminal 6 and the odd numbered electrodes being connected to clocking signal inputs terminal 7. The clocking signal drive circuit 8 supplies clocking signals $\phi_1$ and $\phi_2$ to terminals 6 and 7, respectively, in the same manner in FIG. 7 as it does in FIG. 6, and in response to these clocking signals charge is shifted from one electrode to another within the CCD.

Figure 8:
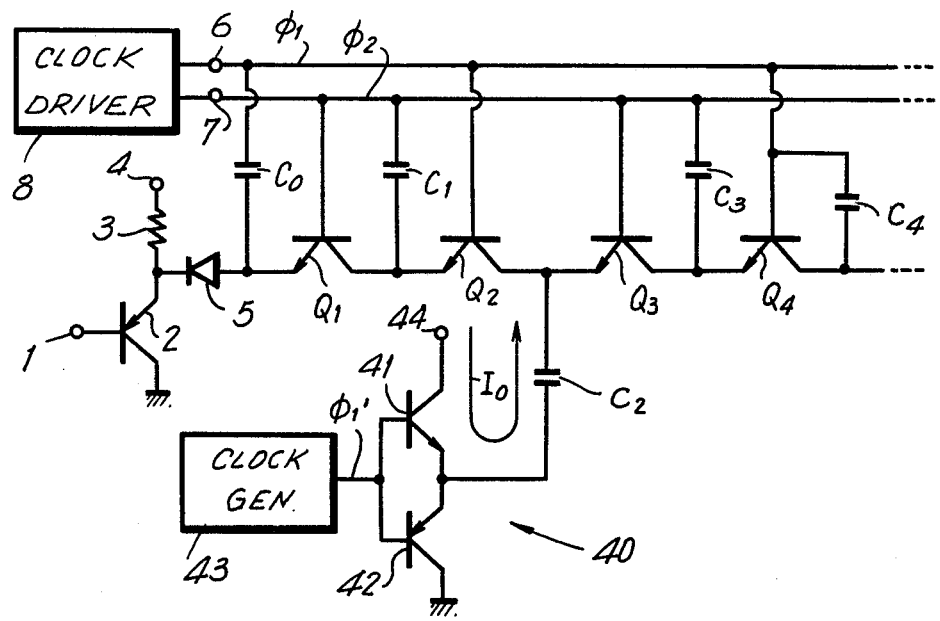
FIGS. 8 and 9 are schematic diagrams of a BBD employing clocking signal drive circuits according to respective embodiments of the present invention to determine the charge level on one capacitor of the BBD.

As has been shown, the clocking signal drive circuit of the present invention has the advantages that it can operate at a high frequency and that it requires few transistors. But in addition it also has the further advantage that it can be used as an output device for measuring the signal level on one or more of the capacitive storage elements of a CTD. FIG. 8 illustrates a clocking signal drive circuit according to the present invention being put to just such a use.

The circuitry of FIG. 8 is very similar to that of FIG. 3, except that in FIG. 8 the even numbered capacitor $C_2$ from which it is desired to drive a signal output, is not connected to an emitter follower transistor, but rather is connected to a clocking signal drive circuit 40 constructed according to the present invention, and the clocking end of capacitor $C_2$ is disconnected from the clocking signal input terminal 6 and instead is connected to the junction between complementary transistors 41 and 42. The clocking signal drive circuit 40 is comprised of a complementary pair of transistors 41 and 42 similar to transistors 31a and 32a of FIG. 5 and a clocking signal generator 43, similar to the clocking signal generator 10 of FIGS. 1, and 5 through 8. The bases of the transistors 41 and 42 are connected together and are supplied with the $\phi_1'$ clocking control signal generated by the clocking signal generator 43. The clocking control signal $\phi_1'$ is of the same phase as the clocking signal $\phi_1$ supplied to the clocking signal input terminal 6 by the clocking signal driver 8 which can be constructed according to the present invention as shown in FIG. 5. The clocking control signal $\phi_1'$ alternates between a low level voltage $V_{DC}-V_{be}$ and a high level voltage $V_{DC}+V_P+V_{be}$, where $V_{be}$ if offset voltage of the base-emitter junction of the complementary transistors 41 and 42. The collector of the PNP transistor 42 is grounded and an output terminal 44 is connected to the collector of the NPN transistor 41.

In operation the clocking signal drive circuit 40 of FIG. 8 provides a voltage to the clocking end of capacitor $C_2$ which is identical in amplitude and phase to the clocking signal $\phi_1$. During the period when the clocking signal $\phi_1$ is equal to $V_{DC}+V_P$ and when an input signal $V_{S1}$ is applied to the input terminal 1, the charge of $[V_{S1}-(V_{DC}+V_P)]C$ is stored in the capacitor $C_0$, and during the succeeding period when the clocking signal $\phi_2$ is equal to $V_{DC}+V_P$, the charge level of the capacitor $C_0$ is transferred to the capacitor $C_1$. During the following period when the clocking signal $\phi_1$ is once again equal to $V_{DC}+V_P$, charge flows in the direction indicated by the arrow $I_0$ in FIG. 8 from output terminal 44, through the collector-emitter path of transistor 41, through capacitor $C_2$ and transistor $Q_2$, to capacitor $C_1$. Therefore by measuring the amount of current which flows from output terminal 44 to the capacitor $C_1$ it is possible to derive an output signal which varies in proportion to the input signal $V_{S1}$ and which is delayed relative to that input signal by one clock period $\tau$, where $\tau$ equals $1/f_C$ and where $f_C$ is the clocking signal frequency. If desired, the output circuit disclosed in FIG. 8 can be used to determine the signal $V_{S1}$ at times delayed by $2\tau, 3\tau, \ldots$ relative to the input signal by connecting the junction of the emitter of transistors 41 and 42 to the clocking side of even numbered capacitor $C_4, C_6 \ldots$, respectively.

It should be noted that since the clocking signal drive circuit comprised of transistors 41 and 42 provides a clocking signal, to the clocking side of capacitor C$_2$ which has the same voltage and phase as the clocking signal φ$_1$, the charge and voltage levels upon capacitor C$_2$ are identical to those which would exist if the clocking side of that capacitor was connected to clocking signal input terminal 6. Therefore, the operation of the output circuit of FIG. 8 does not change in any way the charge and voltage levels stored on and passing through the capacitor from which it derives output information.

Figure 9:
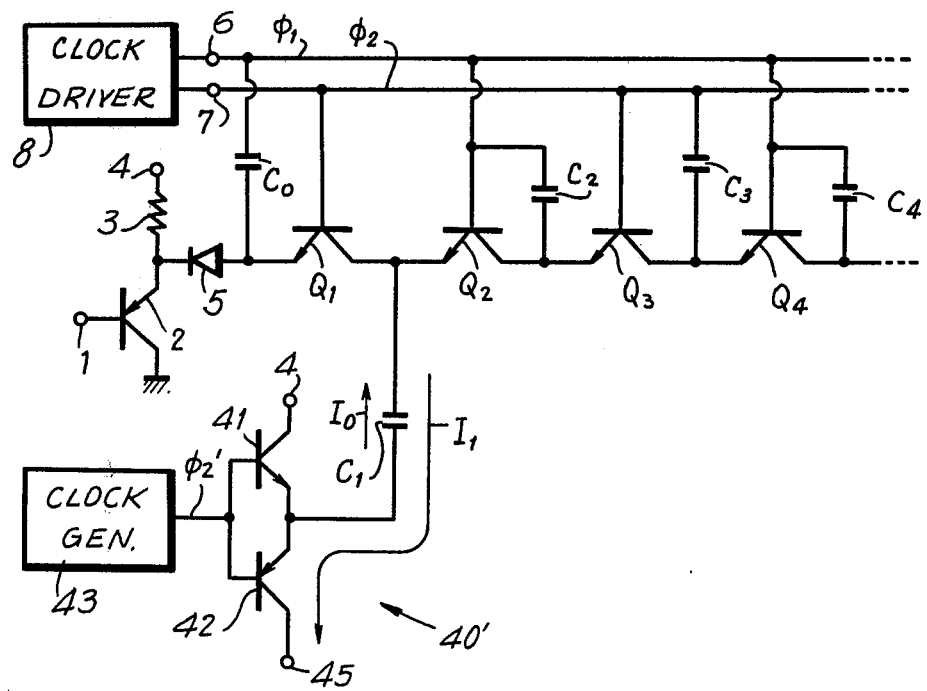

Another embodiment of the invention is shown in FIG. 9, in which the clocking side of an odd numbered capacitor, for example, the capacitor C$_1$, is disconnected from the clocking signal input terminal 7, and is connected to the junction of the emitters of transistors 41 and 42. The bases of transistors 41 and 42 are connected together and to the clocking control signal φ$_2$' from the generator 43. The clocking control signal φ$_2$' is of the same phase as the clocking signal φ$_2$ supplied to the clocking signal input terminal 7, and it alternates between the voltage V$_{DE}$−V$_{be}$ and V$_{DC}$+V$_P$+V$_{be}$. As a result, the voltage supplied to the clocking side of capacitor C$_1$ is equal in voltage and phase to that supplied to the clocking signal input terminal 7. Further, in FIG. 9, a collector of the NPN transistor 41 is connected to a power supply terminal 4 and an output terminal 45 is led out from the collector of the PNP transistor 42. In this circuit, during the period when the clocking signal φ$_1$ is high immediately after the input signal V$_{S1}$ is supplied to the input terminal 1, a charge of [V$_{S1}$−(V$_{DC}$+V$_P$)]×C is stored in the capacitor C$_0$. During the succeeding period when the clocking signal φ$_2$ is high, capacitor C$_1$ discharges from a charge V$_P$×C to the charge formerly on capacitor C$_0$, so that a total charge equal to (V$_{DC}$+2V$_P$−V$_{S1}$)×C flows in the direction shown by the arrow I$_0$ from terminal 4 through the collector-emitter path of transistor 41, capacitor C$_1$ and transistor Q$_1$ to capacitor C$_0$. Then, during the following period when the clocking signal φ$_1$ is once again high and has the voltage V$_{DC}$+V$_P$, a similar electron charge of (V$_{DC}$+2V$_P$−V$_{S1}$)×C flows in the direction shown by the arrow I$_1$ from capacitor C$_2$ through transistor Q$_2$, capacitor C$_1$, and the emitter-collector path of transistor 42 to output terminal 45.

In this circuit, as in the circuit of FIG. 8, output information is derived during the period that capacitor C$_2$ transfers its charge to capacitor C$_1$, and the signal derived is delayed relative to the input signal by one clocking period τ. It should be obvious that signal delays of 2τ, 3τ, . . . can be achieved by connecting the clocking end of a respective one of capacitors C$_3$, C$_5$, . . . , to the emitters of transistors 41 and 42. It will also be seen that, if the clocking signal drive circuit in FIG. 8 has the collector of transistor 41 connected to a positive power supply terminal and if an output terminal is led from the collector of transistor 42, or if the clocking signal drive circuit of FIG. 9 is altered by connecting the collector of transistor 42 to ground and connecting an output terminal to the collector of transistor 41, then an output signal can be derived which is delayed relative to the input signal by a selected period of 0.5τ, 1.5τ, 2.5τ, . . . . It should be noted that in the circuits of FIGS. 8 and 9 the collector voltage of the transistor from which the output current is obtained should be selected so that its associated transistor will not saturate.

Figure 10:
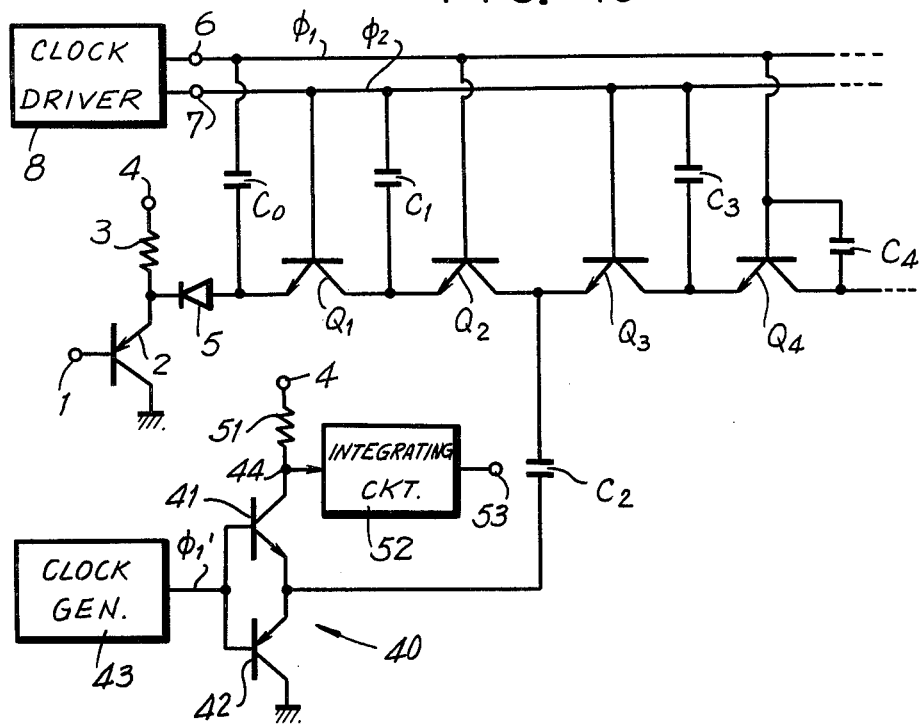
FIGS. 10, 11, 12 and 13 are schematic diagrams of apparatus similar to that of FIGS. 8 and 9, but including additional circuitry for converting an output current through one terminal of the clocking signal drive circuit into a corresponding output voltage signal.

Referring now to FIG. 10, it will be seen that the circuit there illustrated is identical to that of FIG. 8, except that it also includes means for converting the output current through terminal 44 into an output voltage. More particularly, the terminal 44 is shown on FIG. 10 to be connected to a power supply terminal 4 through a resistor 51 and the resulting output voltage at the terminal 44 is supplied through an integrating circuit 52 to an output terminal 53. The voltage derived at output terminal 53 is equal to the voltage at power supply terminal 4 minus the average voltage drop across resistor 51. Thus the output voltage V$_{out}$ at terminal 53 can be expressed as:

$$V_{out} = V_{CC} - \frac{(V_{DC} + 2V_P - V_{S1})C}{\tau} \cdot R = \quad (12)$$

$$V_{CC} - (V_{DC} + 2V_P)fc \cdot RC + V_{S1}fcRC$$

An output voltage can also be obtained by connecting a sampling and hold circuit, instead of the integrating circuit 52, to the junction or terminal 44 between the resistor 51 and the collector of transistor 41.

Figure 11:
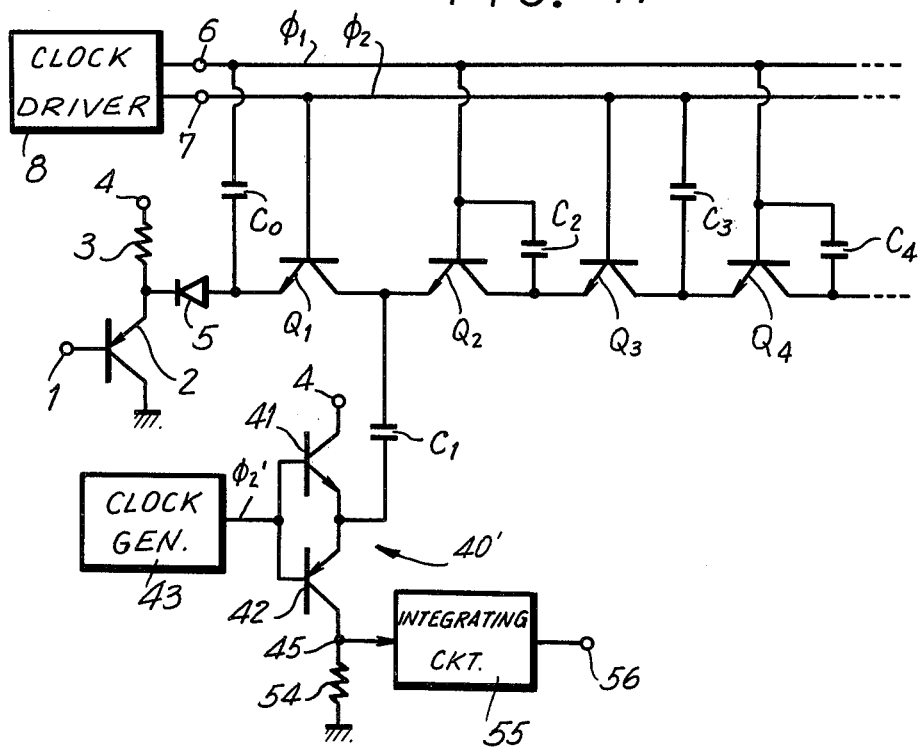

FIG. 11 shows a circuit which is identical to that shown in FIG. 9 except that it also comprises circuitry, similar to that shown in FIG. 10, for converting the output current through terminal 45 into an output voltage. In FIG. 11, the output terminal 45 is connected to ground through a resistor 54 having a resistance R. The voltage obtained at the terminal 45 is supplied through an integrating circuit 55 to an output terminal 56 and the voltage V$_{out}$ derived at terminal 56 is expressed as:

$$V_{out} = \frac{(V_{DC} + 2V_P - V_{S1})C}{\tau} \cdot R = \quad (13)$$

$$(V_{DC} + 2V_P)fcRC - V_{S1}fcRC$$

Figure 12:
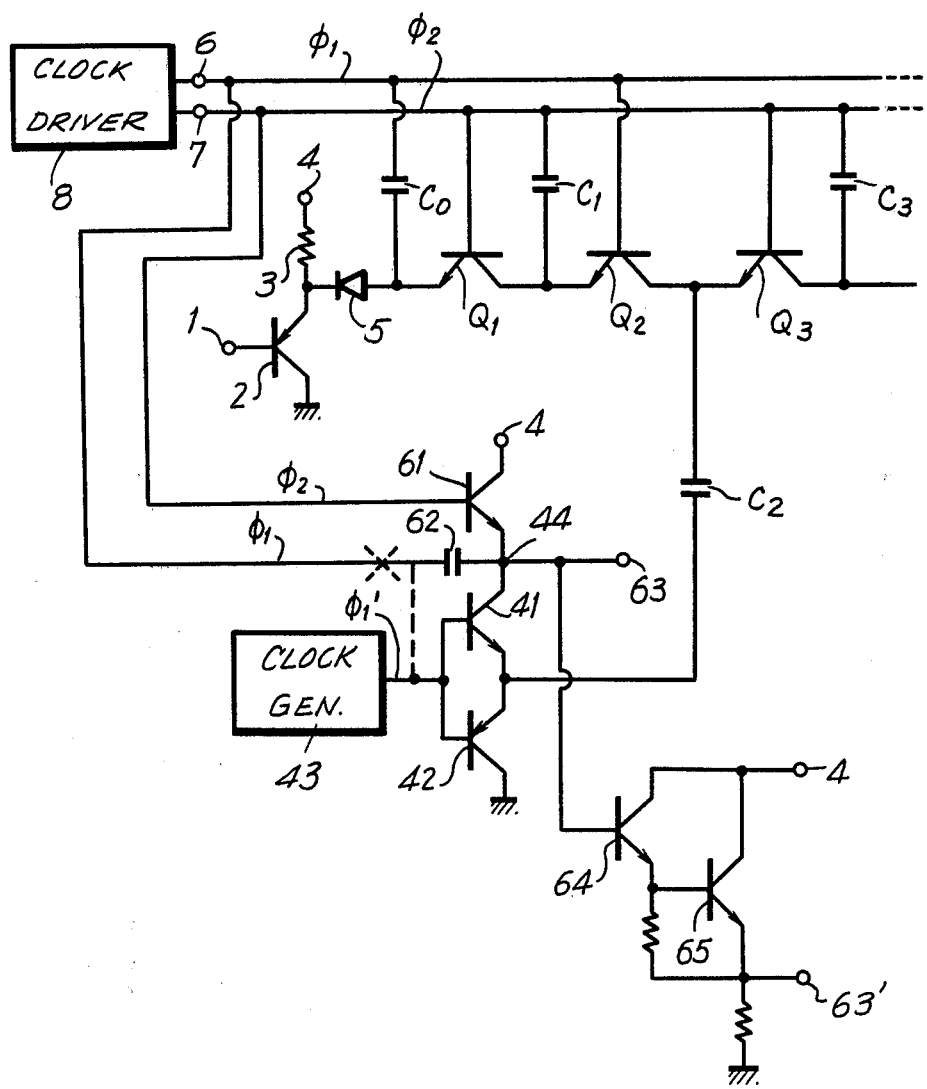

FIG. 12 discloses a circuit which is identical to that shown in FIG. 8 except that it includes a means, different from that disclosed in FIGS. 10 and 11, for deriving an output voltage from the output current which flows through terminal 44. In FIG. 12, the terminal 44 is connected to a power supply terminal 4 through the collector-emitter path of an NPN transistor 61 which has its base connected to clocking signal input terminal 7. A capacitor 62 with a capacitance value C equal to that of all of the capacitors C$_0$, C$_1$, C$_2$, . . . , is connected, at one end or plate, to the clocking signal input terminal 6 and is connected, at its other end or plate, to terminal 44. An output terminal 63 is led out from this other plate of capacitor 62.

The circuit of FIG. 12 operates to charge and discharge capacitor 62 so that its charge and voltage levels have substantially the same amplitude and phase as that of capacitor C$_2$. During the period that clocking signal φ$_2$ is high and equal to V$_{DC}$+V$_P$ and clocking signal φ$_1$ is low and equal to V$_{DC}$, capacitor 62 is charged with a voltage V$_P$. During the subsequent period when the clocking signal φ$_1$ is high at a time τ after an input signal V$_{S1}$ is supplied to input terminal 1, a charge in the amount of (V$_{DC}$+2V$_P$−V$_{S1}$)×C flows from the more positive end of capacitor 62 through the collector-emitter path of transistor 41, capacitor C$_2$, and transistor Q$_2$ to capacitor C$_1$. As a result, at the end of this period when the clocking signal φ$_1$ is high, the voltage which remains across capacitor 62 is equal to V$_{S1}$−(V$_{DC}$+V$_P$). Since, at this time, the voltage of the clocking signal φ$_1$ applied to the clocking side of capacitor 62 has the value V$_{DC}$+V$_P$, the side of capacitor 62 which is connected to output terminal 63 has a voltage which is equal to that of the clocking signal φ$_1$ plus the charge across capacitor 62, which output voltage is expressed as:

$$V_{out} = V_{S1} - (V_{DC} + V_P) + V_{DC} + V_P = V_{S1} \qquad (14)$$

Thus, it can be seen that the voltage derived at output 63 is substantially equal to the voltage $V_{S1}$ originally applied to input terminal 1. However, in the circuit of FIG. 12, due to the voltage drops across the base-emitter junction of transistor 2 and the diode 5 which form a part of the input circuit of the bucket brigade device, the output voltage is higher than the actual voltage applied to the input terminal 1 by an amount equal to $2 \times V_{be}$. To remove this DC voltage level shift it is possible to connect the output terminal 63 to a darlington emitter follower circuit comprised of transistors 64 and 65, as shown in FIG. 12. This darlington circuit not only has the advantage of removing the DC level shift but it also has a very high input impedance which prevents the output voltage at the more positive end of capacitor 62 from being substantially affected by current drawn from an output terminal 63' of the darlington pair.

It should be noted that the clocking end of capacitor 62 could be connected to the output of clocking signal generator 43, as shown with a broken line on FIG. 12, instead of being connected to the clocking signal input terminal 6. However, in the case of such modification, the output voltage derived from terminal 63 or 63' will be increased by a voltage of $2V_{be}$ because, when $\phi_1'$ is low, it has a voltage that is $V_P + V_{be}$ lower than the high voltage of clocking signal $\phi_2$ and thus capacitor 62 will initially charge to a voltage of $V_P + V_{be}$ instead of merely $V_P$, and, when $\phi_1'$ is high, it has a voltage which is $V_{be}$ higher than 100 $_1$, which causes an extra voltage of $V_{be}$ to be added to the charge on capacitor 62.

Figure 13:
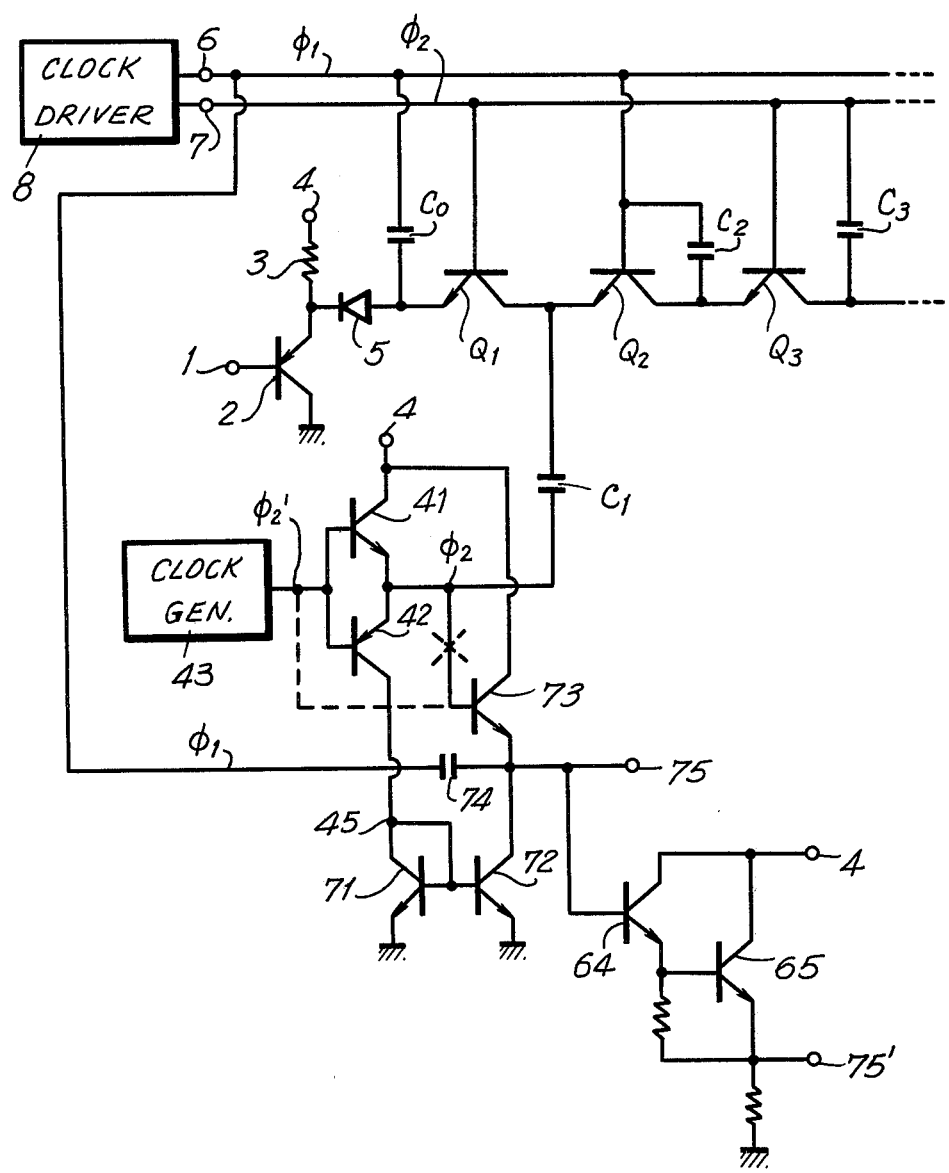

Referring now to FIG. 13, it will be seen that the circuit there shown is identical to that of FIG. 11 except that it includes a different means for converting the current at output terminal 45 into a voltage output signal. In FIG. 13, terminal 45 is connected to both the collector and base of a transistor 71 acting as a diode in a current mirror circuit which further includes a transistor 72. The emitters of transistors 71 and 72 are grounded, and the base of transistor 72 is connected to the base and collector of transistor 71. The collector of transistor 72 is connected to power supply terminal 4 through the collector-emitter path of a transistor 73. The base of the transistor 73 is connected to the junction of the emitters of transistors 41 and 42 so that it receives a signal having the same frequency and phase as the clocking signal $\phi_2$. A capacitor 74 has one plate connected to the clocking signal input terminal 6 and another plate connected to the junction between the emitter of transistor 73 and the collector of transistor 72. Capacitor 74 has a capacitance C equal to the capacitance of capacitors $C_0, C_1, C_2, \ldots$. An output terminal 75 is connected to the plate of capacitor 74 which is connected to the collector of transistor 72. The circuit of FIG. 13 causes the capacitor 74 to have voltage and charge levels which are substantially the same in amplitude and phase as those of capacitor $C_1$. During the period that clocking signal $\phi_2$ has a voltage $V_{DC} + V_P$ and clocking signal $\phi_1$ has a voltage $V_{DC}$, transistor 73 is turned on and it supplies the known charge of $V_P$ across capacitor 74. During the subsequent period when clocking signal $\phi_1$ has the voltage $V_{DC} + V_P$ at a time $\tau$ after the input signal $V_{S1}$ is applied to input terminal 1, a charge in the amount of $(V_{DC} + 2V_P - V_{S1}) \times C$ flows from capacitor $C_2$ through transistor $Q_2$, capacitor $C_1$, the emitter-collector path of transistor 42 and the collector-emitter path of transistor 71. As a result, an equal amount of current flows through transistor 72 of the current mirror circuit from capacitor 74 so as to discharge that capacitor to a voltage of $V_{S1} - (V_{DC} + V_P)$. At this time, the voltage of clocking signal $\phi_1$ applied to the respective plate of capacitor 74 is $V_{DC} + V_P$. Thus the voltage at the other plate of capacitor 74 and, hence, at the output terminal 75 is expressed as:

$$V_{out} = V_{S1} - (V_{DC} + V_P) + V_{DC} + V_P = V_{S1} \qquad (15)$$

A darlington pair circuit comprised of transistors 64 and 65 can again be connected to output terminal 75 of the circuit shown in FIG. 13 in the same manner that it is connected to the output terminal 63 of FIG. 12 for the purpose of connecting the DC level shift caused by transistor 2 and diode 5 and for the purpose of allowing the voltage at output terminal 75 to be determined without drawing much current from capacitor 74. It should also be noted that the base of transistor 73 can be connected to the output of clock signal generator 43, as shown by the broken lines on FIG. 13, instead of being connected to the junction of the emitters of transistors 41 and 42. In the case of such modification, however, the output signal $V_{out}$ that is derived will be raised by a voltage $V_{be}$, because when the clocking control signal $\phi_2'$ is high and the clocking signal $\phi_1$ is low, a charge of $V_P + V_{be}$, rather than $V_P$, will be placed upon capacitor 74 by transistor 73.

Figures 14, 15:
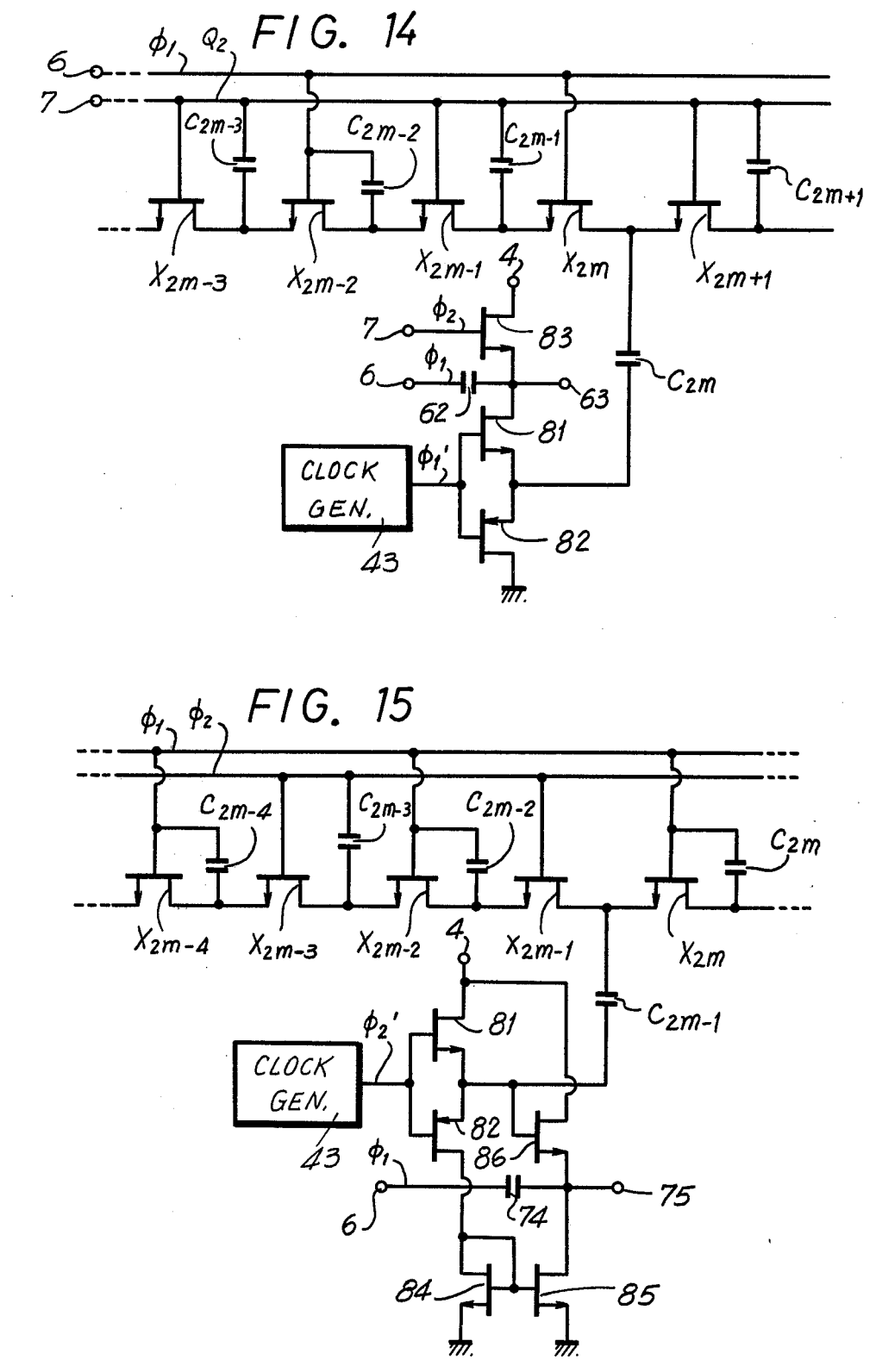

FIGS. 14 and 15 disclose bucket brigade devices which are virtually identical to those disclosed in FIGS. 12 and 13, respectively, except for the fact that field effect transistors are used instead of bi-polar transistors. In FIG. 14 an output signal is derived from a capacitor $C_{2m}$, where m is a non-negative integer, and the transistors 41 and 42 of FIG. 12 are replaced by complementary FETs 81 and 82, which are N channel and P channel, respectively, and the transistor 61 is replaced by an N channel FET 83. In FIG. 15, the output signal is derived from a capacitor $C_{2m-1}$ and the transistors 41,42,71,72 and 73 of FIG. 13 are replaced by FETs 81,82, 84,85 and 86, respectively, all of which are N channel FETs except for P channel FET 82. Here, as in FIG. 14, FETs 81 and 82 are complementary transistors. The circuits of FIGS. 14 and 15 operate in virtually the same manner as the circuits of FIGS. 12 and 13, respectively. By selecting the high and low voltage levels of the clocking control signals $\phi_1'$ and $\phi_2'$ to be equal to $V_{DC} - V_{GS}'$ and $V_{DC} + V_P + V_{GS}$, respectively, where $V_{GS}$ in the offset voltage between the gate and the source of FET 81 when it is conductive and $V_{GS}'$ is the offset voltage between the gate and the source of FET 82 when it is conductive, the same output voltages can be obtained as in FIGS. 12 and 13.

Figure 16:
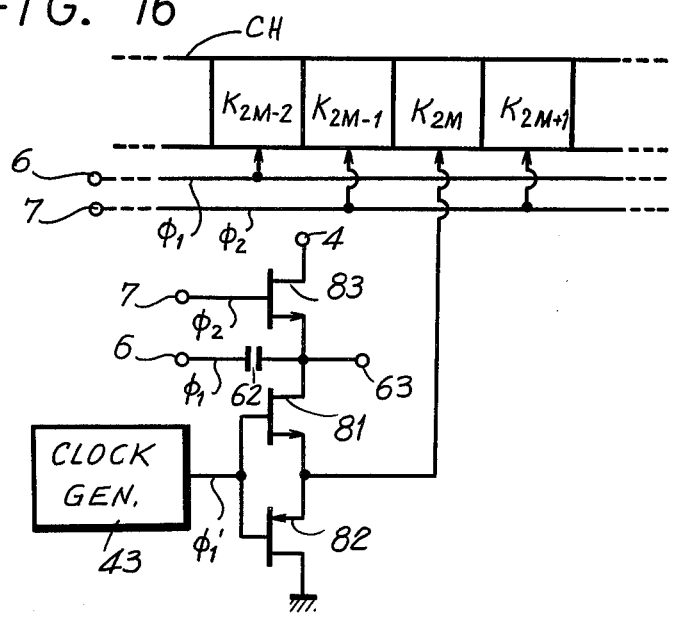
FIGS. 16 and 17 are schematic diagrams of other charge coupled devices (CCDs) having identical output circuits to those disclosed in FIGS. 14 and 15, respectively.
Figure 17:
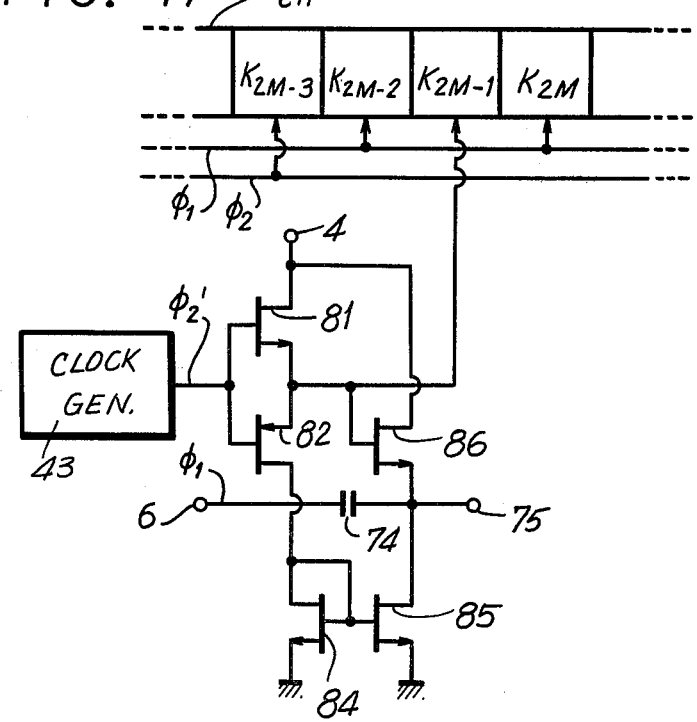

FIGS. 16 and 17 disclose charge coupled devices to which the field effect clocking signal drive circuits of FIGS. 14 and 15 are applied, respectively, for the purpose of determining the charge level on one of the electrodes of such a CCD.

In FIG. 16 an output signal is derived from the electrode $K_{2m}$ which is connected to the junction of the drains of the complementary FETs 81 and 82 when, in response to the clocking signals, a charge in the channel CH is moved from under the electrode $K_{2m-1}$ to the electrode $K_{2m}$ and a corresponding amount of opposite charge flows from the electrode $K_{2m-1}$ to the electrode $K_{2m}$ through the clocking circuit. In FIG. 16, this current flows to the electrode $K_{2m}$ from the capacitor 62, and the amount of such current indicates the level of the charge which has been transferred to capacitor $K_{2m}$.

In FIG. 17, an output signal is obtained from the CCD electrode $K_{2m-1}$ which is connected to the junction of the drains of the complementary FETs 81 and 82. When, in response to the clocking signals, a charge in the channel CH moves from under the electrode $K_{2m-1}$ to the electrode $K_{2m}$, and a corresponding amount of opposite charge flows from the electrode $K_{2m-1}$ to the electrode $K_{2m}$. In FIG. 17, this current flows from the electrode $K_{2m}-1$ through the source-drain path of FET 82 and down to ground through the diode-connected FET 84 which forms the input of the current mirror circuit comprised of transistors 84 and 85. As a result of the foregoing, a corresponding amount of current flows through transistor 85 from capacitor 74 for producing a voltage at output terminal 75 which indicates the level of the charge which has been transferred to electrode $K_{2m}$.

In the charge transfer devices (CTDs) described above, the clocking signal drive circuits used to obtain an output have been connected to only one capacitive storage means at a time. However, an important feature of the clocking signal drive circuit according to the present invention is that the same can be connected to a plurality of stages within a CTD so as to derive an output based on the signal level of each of those capacitive storage means. In that case, the present invention provides a means for causing a CTD to act as a transverse filter which has relatively few components to reduce its requirements in terms of space, cost and current consumption. Further, such transverse filter according to this invention avoids the problems of the stray capacitance $C_{CB}$, the base current and the complexity of properly adjusting a series of differential amplifiers which are encountered in prior art CTDs employing a plurality of emitter-follower circuits arranged to operate as a transverse filter.

Figure 18:
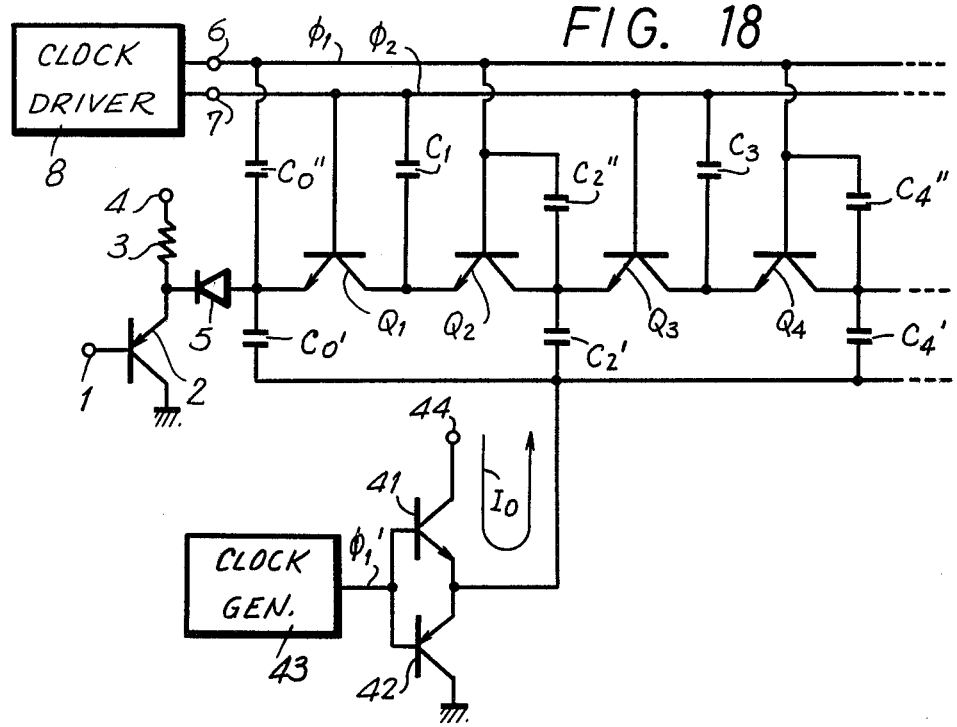
FIGS. 18 to 27 are schematic diagrams which correspond to FIGS. 8 to 17, respectively, but which show the use of the respective circuits to form filter circuits.

FIG. 18 discloses a circuit which is identical to that disclosed in FIG. 8 except for the fact that each of the even numbered capacitors $C_0$, $C_2$, $C_4$, ... is divided into two parts or pieces, $C_0'$, $C_0''$; $C_2'$, $C_2''$; $C_4'$, $C_4''$; ..., respectively. The capacitive value of each of the two pieces of each of the even numbered capacitors is selected so that its sum is equal to C, that is, $C_0' = a_0 \times C$, $C_0'' = (1-a_0) \times C$; $C_2' = a_2 C$, $C_2'' = (1-a_2) \times C$; $C_4' = a_4 \times C$, $C_4'' = (1-a_4) \times C$; .... The clocking terminals of the partial capacitors $C_0'$, $C_2'$, $C_4'$, ... are all connected to the junction of the emitters of transistors 41 and 42, and the clocking terminals of the partial capacitors $C_0''$, $C_2''$, $C_4''$, ... are all connected to the clocking input terminal 6. The clocking control signal $\phi_1'$ is supplied by the clocking signal generator 43 to the bases of transistors 41 and 42 and the collector of transistor 42 is grounded and an output terminal 44 is drawn from the collector of transistor 41.

The operation of FIG. 18 is as follows:

During the period when the clocking signal $\phi_1$ is high immediately after an input signal $V_{S1}$ is supplied to the input terminal 1, the voltage across the capacitor $C_0'$ changes to $V_{S1} - (V_{DC} + V_P)$ from the voltage $V_P$, and as a result an electron charge of:

$$a_0 C[V_P - V_{S1} - (V_D + V_P)] = a_0 C(V_{DC} + 2V_P - V_{S1}) \quad (16)$$

is discharged from capacitor $C_0'$ and such charge flows from output 44 through the collector-emitter path of transistor 41 to capacitor $C_0'$, as is indicated by the arrow $I_0$ in FIG. 18. At a time one full clock period $\tau$ (where $\tau = 1/f_C$) later, when the clock signal $\phi_1$ is once again high, capacitor $C_2'$ similarly discharges by an amount equal to:

$$a_2 C[V_P - V_{S1} - (V_{DC} + V_P)] = a_2 C[(V_{DC} + 2V_P) - V_{S1}] \quad (17)$$

which charge also flows from output terminal 44 through the collector-emitter path of transistor 41 in the path indicated at $I_0$ on FIG. 18. In a like manner, during the next period when the clocking signal $\phi_1$ is again high, at a time $2\tau$ after the initial period when the input signal $V_{S1}$ is introduced to capacitors $C_0'$, the capacitor $C_4'$ discharges by an amount equal to:

$$a_4 C[V_P - (V_{S1} - (V_{DC} + V_P)) ] = a_4 C[(V_{DC} + 2V_P) - V_{S1}] \quad (18)$$

which charge also flows from the output 44 in the path $I_0$ on FIG. 18.

From the above equations (16), (17) and (18), it can be determined that the total amount of charge which flows from the output terminal 44 through the collector-emitter path of transistor 41 in the direction indicated at $I_0$ on FIG. 18 can be expressed as follows:

$$\phi_{out} = [(V_{DC} + 2V_P) - V_{S1}]C(a_0 + a_2 z^{-1} + a_4 z^{-2} + \ldots) \quad (19)$$

Here $z = e^{s\tau}$ $S = f\omega = f \cdot 2\pi f$ (f is the frequency of the input signal to which the filter is tuned). This total charge $\phi_{out}$ which flows into the output terminal 44 is equal to a weighted sum of the charge upon each of the capacitors to which the emitters of transistors 41 and 42 are connected. The signals at the sampled capacitors $C_0'$, $C_2'$, $C_4'$, ... are delayed relative to the value of the input signal applied to input terminal 1 by a time 0, $\tau$, $2\tau$, ..., respectively. Accordingly, by selecting the coefficients $a_0$, $a_2$, $a_4$, ..., as desired, the filter circuit of FIG. 18 can be made to have a desired frequency response.

The average current flowing into terminal 44 is as follows:

$$I_{AV} = \frac{\phi_{out}}{\tau} = f_C \cdot \phi_{out} \quad (20)$$

Thus, the average output current is a function both of the frequency of the clocking signals supplied to the charge transfer device as well as of the frequency of the input signal $V_S$.

As can be seen from FIG. 18, one of the advantages of the clocking signal drive circuit according to the present invention is that it can be used to determine the signal level in a capacitive storage means of a charge transfer device by measuring an amount of current flowing into or out of that capacitive storage means. As a result, the clocking signal drive circuit according to the present invention can be used to measure the signal level in a plurality of capacitive storage means merely by measuring the amount of current which flows into or out of a plurality of such capacitive storage means. Further, by suitably selecting the dividing coefficients of the capacitive storage means to which the clocking signal drive circuit is connected weighting can easily be achieved. Thus, according to the present invention a transverse filter can be formed which is very simple in construction compared to that of the prior art as exemplified by FIG. 4. Since the total capacitance of each of the divided capacitors is equal to that of the corresponding undivided capacitors, and since the clocking signal supplied by the clocking signal drive circuit used as an output device is equal in voltage and phase to that which would be supplied to each of the sampled capacitive stages had it not been divided, the output device according to the present invention does not substantially change the voltage or charge levels of the signals which pass through the capacitive storage means which the output device samples.

Figure 19:
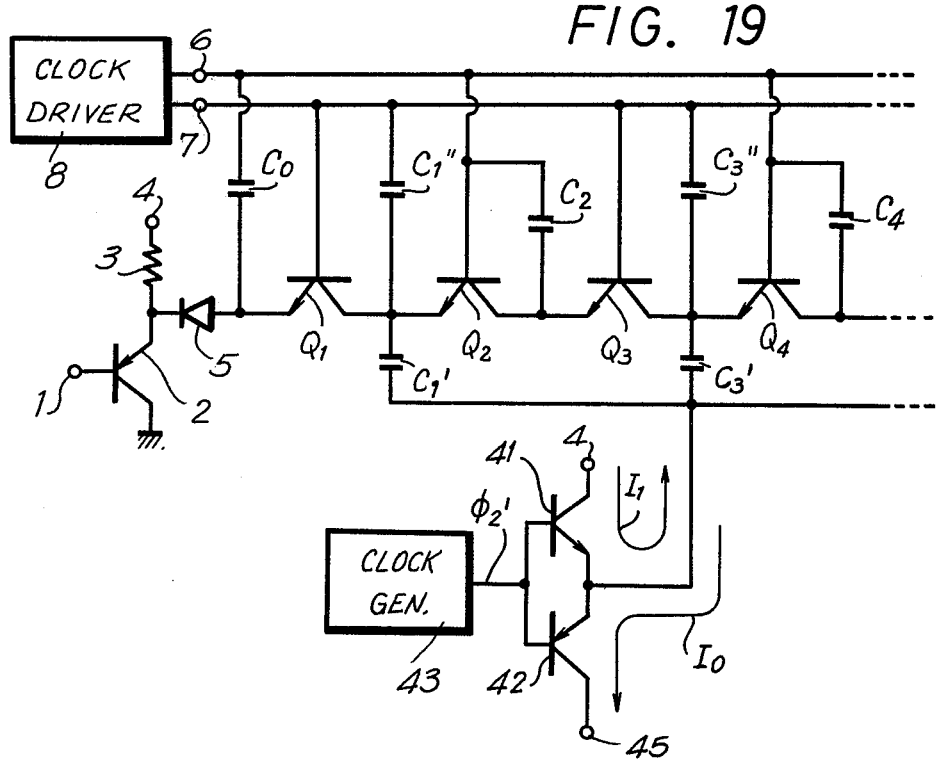

FIG. 19 shows another embodiment of the invention in which a charge transfer device is connected to operate as a transverse filter in conjunction with a clocking signal drive circuit. The circuit of FIG. 19 is identical to that of FIG. 9 except for the fact that the odd numbered capacitors, $C_1, C_3, \ldots$ are each divided into two pieces, $C_1', C_1''; C_3', C_3''; \ldots$ and the capacitance of each such capacitor is selected so that $C_1' = a_1 \times C$, $C_1'' = (1-a_1) \times C$; $C_3' = a_3 \times C$, $C_3'' = (1-a_3) \times C$. The clocking ends of the capacitors $C_1', C_3' \ldots$ are connected to each other and to the junction of the emitters of transistors 41 and 42, and the clocking ends of the capacitors $C_1'', C_3'', \ldots$ are connected together and to the clocking signal input terminal 7. The bases of transistors 41 and 42 receive the clocking control signal $\phi_2'$ from the clocking signal generator 43 which has the same phase as the clocking signal $\phi_2$ supplied to the clock terminal 7. The collector of the NPN transistor 41 is connected to the power supply terminal 4 and the output terminal 45 is connected to the collector of the PNP transistor 42.

The operation of the circuit of FIG. 19 is almost identical to that of the circuit of FIG. 18, except for the fact that it measures currents flowing onto the odd numbered capacitors during the time that each of them is receiving charge from its subsequent even numbered capacitor, rather than measuring currents which flow away from such even numbered capacitors at such time, as does the circuit in FIG. 18. The total charge flowing out of the output terminal 45 is as follows:

$$\phi_{out} = [(V_{DC} + 2V_P) - V_S]C[a_1z^{-1} + a_3z^{-2} + \ldots] \quad (21)$$

$$= [(V_{DC} + 2V_P) - V_S]C \cdot z^{-1}(a_1 + a_3z^{-1} + \ldots)$$

It will be noted that this output signal is identical to that measured in circuit 18 and given by equation (19), except for the fact that coefficients $a_1, a_3, \text{- - -}$ replace the coefficients $a_0, a_2, a_4 \ldots$. Thus, by selecting the value of the coefficients $a_1, a_3, \ldots$, the circuit shown in FIG. 19 can be designed to have a desired frequency response.

Figure 20:
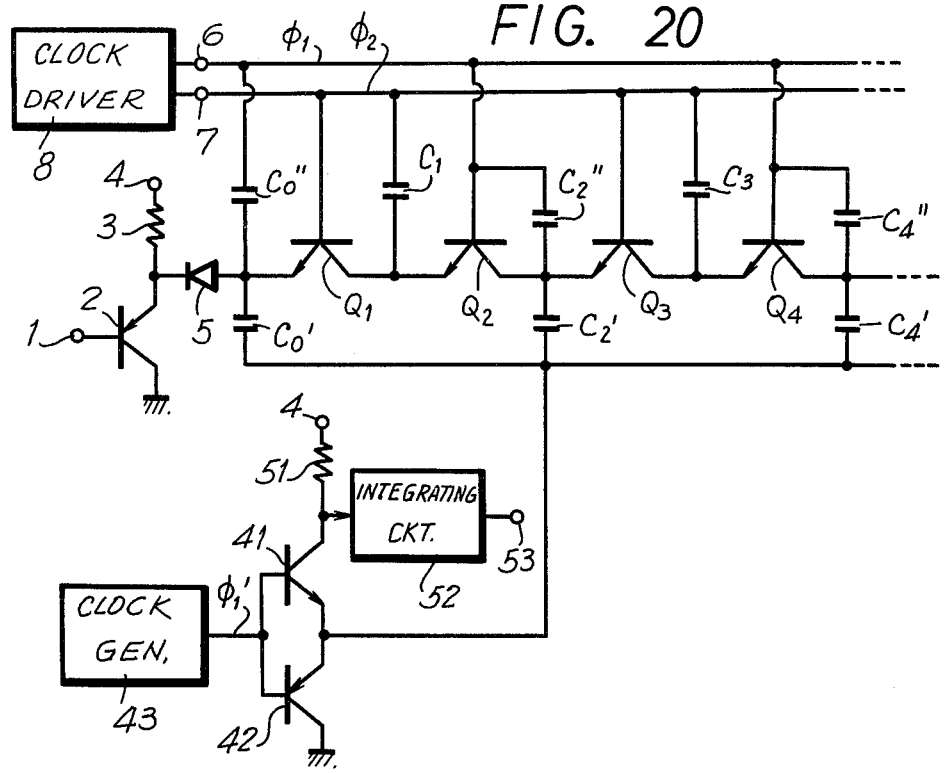
Figure 21:
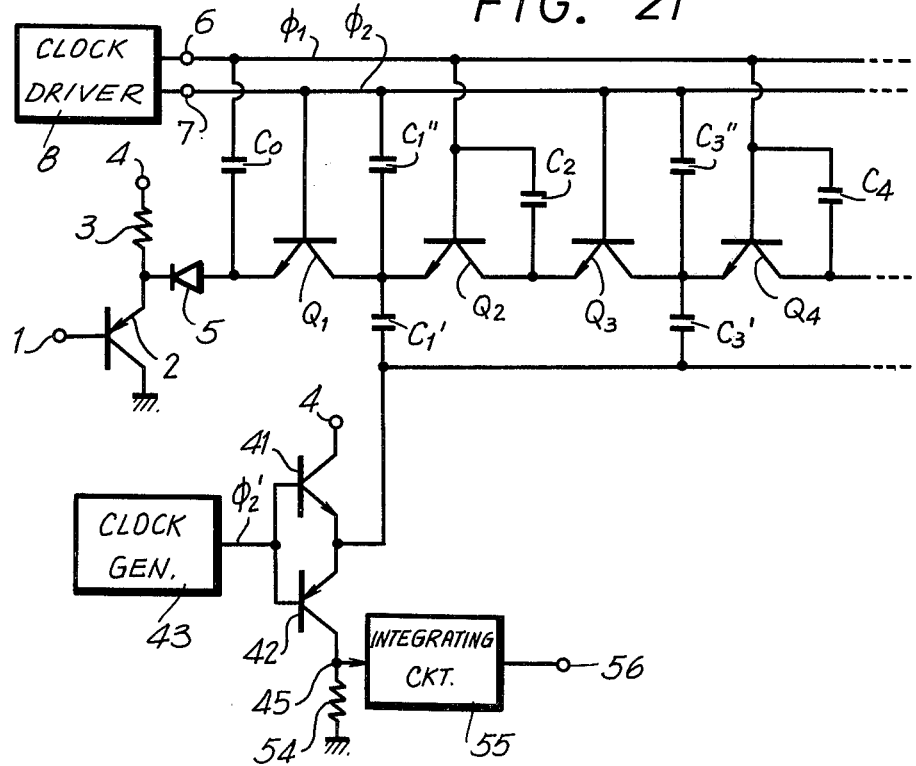

FIGS. 20 and 21 disclose circuits which are identical to those disclosed in FIGS. 18 and 19, respectively, except for the fact that FIGS. 20 and 21 also show the addition thereto of the voltage converting means disclosed in FIGS. 10 and 11 respectively. In FIG. 20, the voltage derived at output 53 is as follows:

$$V_{out} = V_{CC} - R \cdot I_{Av} \quad (22)$$

$$= V_{CC} - R \cdot \phi_{out} \cdot fc$$

-continued
$$= V_{CC} - R \cdot fc\{(V_{DC} + 2V_P) - V_S\}C(a_0 + a_2Z^{-1} + \ldots)$$

Similarly, in FIG. 21, the voltage derived at output 56 is as follows:

$$V_{out} = R \cdot I_{Av} \quad (23)$$

$$= R \cdot \phi_{out} \cdot fc$$

$$= R \cdot fc \cdot \{(V_{DC} + 2V_P) - V_S\}C \cdot Z^{-1}(a_1 + a_3Z^{-1} + \ldots)$$

Figure 22:
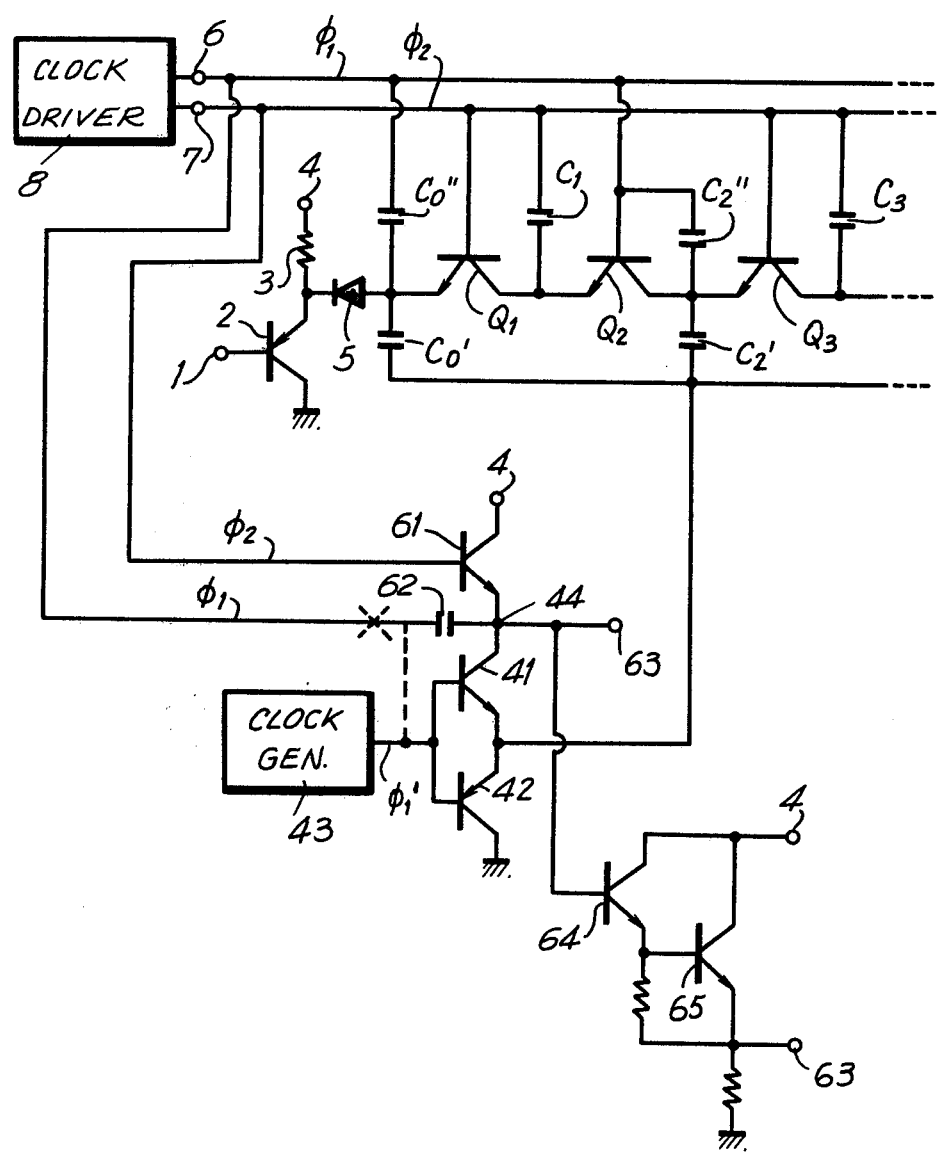
Figure 23:
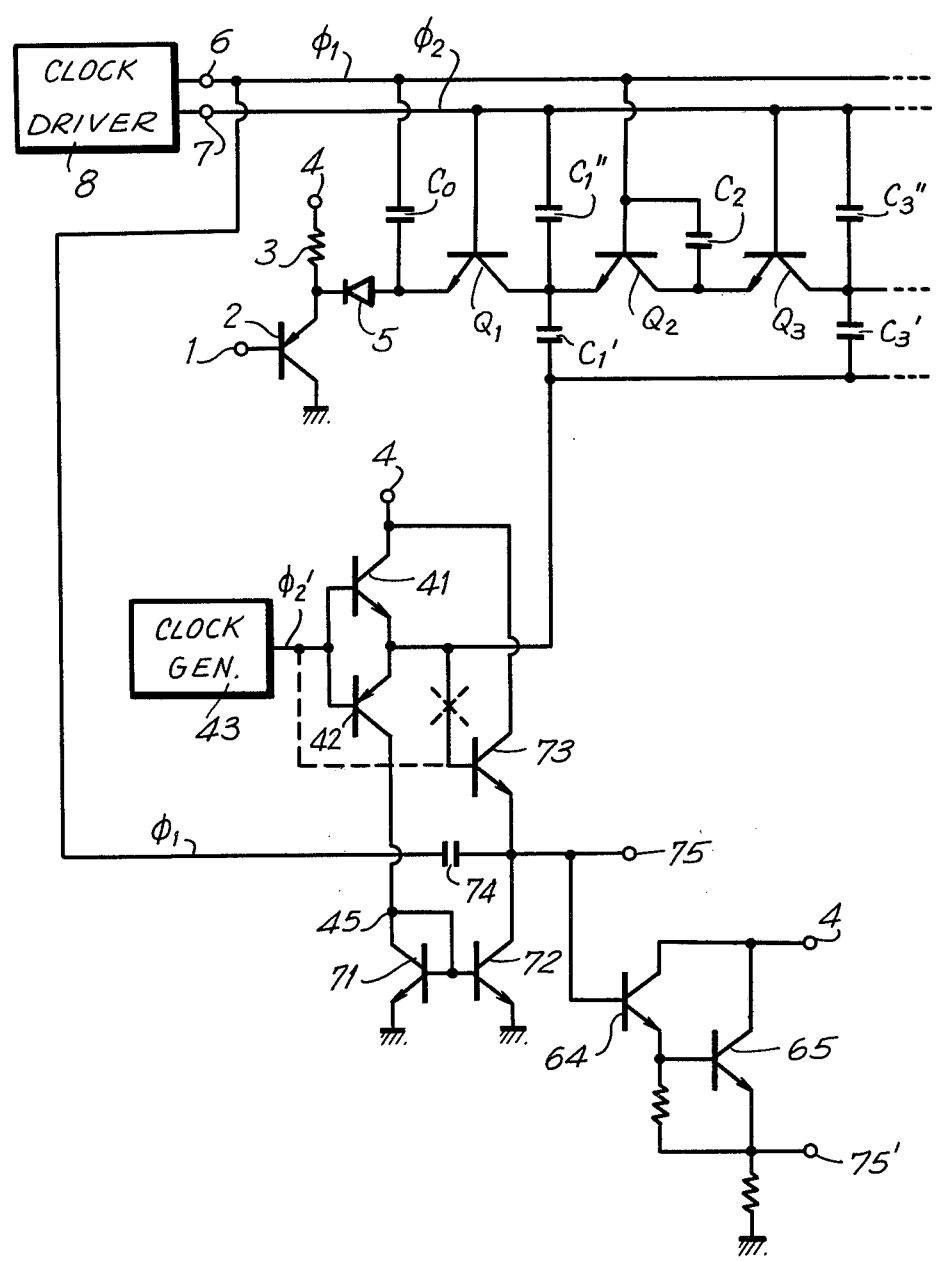

The circuits of FIGS. 22 and 23 are identical to those of FIGS. 18 and 19 except for the fact that they also include the means for converting a current output signal to a voltage output signal as disclosed in FIGS. 12 and 13, respectively.

In the operation of the circuit of FIG. 22, at the end of the period when the clocking signal $\phi_1$ is high, the charge upon the capacitor 62, which in this circuit has the capacitance $C_A$, is equal to:

$$V_P \cdot C_A - \{(V_{DC} + 2V_P) - V_S\}C(a_0 + a_2Z^{-1} + \ldots) \quad (24)$$

Since the voltage $V_{DC} + V_P$ is applied by the clocking signal $\phi_1$ to one plate of capacitor 62 at this time, the output voltage derived from the other plate of capacitor 62 at this time is as follows:

$$V_{out} = \frac{V_P C_A - \{(V_{DC} + 2V_P) - V_S\}C(a_0 + a_2Z^{-1} \ldots)}{C_A} + \quad (25)$$

$$V_{DC} + V_P = \frac{C}{C_A}(a_0 + a_2Z^{-1} + \ldots)V_S +$$

$$\frac{1}{C_A}(V_P C_A - (V_{DC} + 2V_P)C(a_0 + a_2Z^{-1} \ldots)) + V_{DC} + V_P$$

Since $V_S = V_{SDC} + V_{SAC}$, we find that:

$$V_{out} = \frac{C}{C_A}(a_0 + a_2Z^{-1} + \ldots)V_{SAC} + \quad (26)$$

$$\frac{V_P C_A - (V_{DC} + 2V_P - V_{SDC})C(0 + 2Z^{-1} + \ldots)}{C_A} +$$

$$V_{DC}V_P$$

In this last equation the first term is a signal term which varies in response to the variable component $V_{SAC}$ of the signal $V_S$ and the remaining terms are DC level shift terms which are independent of the variable component of the signal $V_S$. Since the frequency of the DC terms of this equation is equal to 0 then $Z^{-1}, Z^{-2}, \ldots$ can all be set equal to one. Therefore, this last equation can be rewritten as follows:

$$V_{out} = \frac{C}{C_A}(a_0 + a_2Z^{-1} + \ldots)V_{SAC} + \quad (27)$$

$$\frac{V_P C_A - (V_{DC} + 2V_P - V_{SDC})C(a_0 + a_2 + \ldots)}{C_A} +$$

$$V_{DC} + V_P$$

Thus in FIG. 22 the signal component of the output voltage is equal to:

$$\frac{C}{C_A}(a_0 + a_2Z^{-1} + \ldots)V_{SAC} \quad (28)$$

and the DC level of the output signal, that is that part of the output signal which is independent of the variable component $V_{SAC}$ of the input signal $V_S$, is as follows:

$$V_{outDC} = \frac{V_P C_A - (V_{DC} + 2V_P - V_{SDC}) C (a_0 + a_2 + \ldots)}{C_A} + V_{DC} + V_P \quad (29)$$

Since the DC level of the input signal is $V_{SDC}$, it can be seen that a DC level shift of $V_{out\ DC} - V_{SDC}$ occurs in the circuitry in FIG. 22.

In FIG. 22 the capacitance of capacitor 62 is chosen to be equal to $(a_0 + a_2 + \ldots)C$, so that the output signal is as follows:

$$V_{out} = \frac{1}{a_0 + a_2 + \ldots} (a_0 + a_2 Z^{-1} + \ldots) V_{SAC} + \quad (30)$$

$$\frac{1}{a_0 + a_2 + \ldots} [V_P(a_0 + a_2 + \ldots) -$$

$$(V_{DC} + 2V_P - V_{SDC})(a_0 + a_2 + \ldots)] + V_{DC} + V_P$$

$$= \frac{1}{a_0 + a_2 + \ldots} (a_0 + a_2 Z^{-1} + \ldots) V_{SAC} + V_{SDC}$$

As can be seen from this equation the DC level of the output voltage is equal to $V_{SDC}$ which is the same as the DC level of the input signal $V_S$. Thus it can be seen that the apparatus of FIG. 22 is capable of providing an output which does not have any DC level shift. The transfer function or signal gain H(Z) of variable input component $V_{SAC}$ between the input and the output is as follows:

$$H(Z) = \frac{1}{a_0 + a_2 + \ldots} (a_0 + a_2 Z^{-1} + \ldots) \quad (31)$$

Thus it can be seen that the output of the FIG. 22 has a desirable AC signal gain for use as a filter circuit, while at the same time having virtually no DC level shift. However, it should be pointed out that the above equations do not take into account the DC level shift which results from the total voltage drop of 2 $V_{be}$ across the diode 5 and the emitter-base junction of transistor 2, which causes the voltage placed on capacitor $C_0'$ to be 2 $V_{be}$ higher than the voltage applied to the input terminal 1. In order to remove this voltage shift the darlington emitter follower circuit comprised of transistors 64 and 65 can be used in the same manner as they are in FIG. 12.

As was stated above, the circuitry of FIG. 23 is identical to that of FIG. 19 except that it also has the circuitry used in FIG. 13 for converting the output current at terminal 45 to a corresponding output voltage. The operation of FIG. 23 is substantially the same as that of FIG. 22 except that it measures the amount of current which flows onto odd numbered capacitors from the subsequent even numbered capacitors, rather than measuring the amount of current which flows from the even numbered capacitors to the preceding odd numbered ones. The capacitor 74 in the circuit 23 has a capacitance equal to $(a_1 + a_3 + \ldots)C$, so that, by reasoning similar to that applied in the discussion of FIG. 22, the output voltage of this circuit is as follows:

$$V_{out} = \frac{1}{a_1 + a_3 + \ldots} (a_1 + a_3 Z^{-1} + \ldots) Z^{-1} \cdot V_{SAC} + V_{SDC} \quad (32)$$

Figure 24:
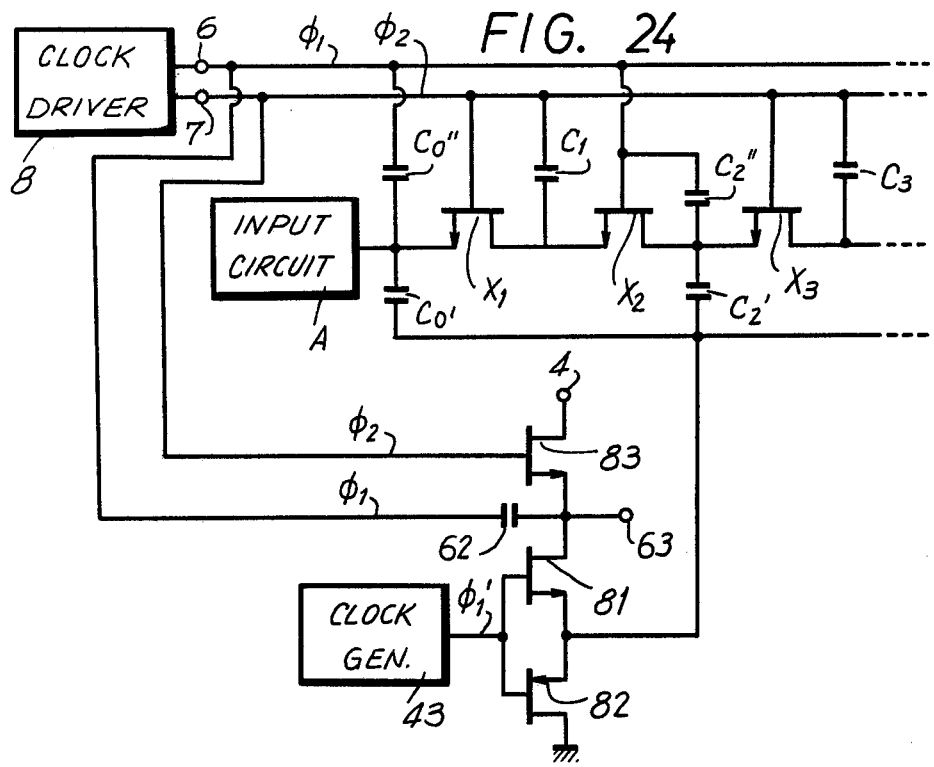
Figure 25:
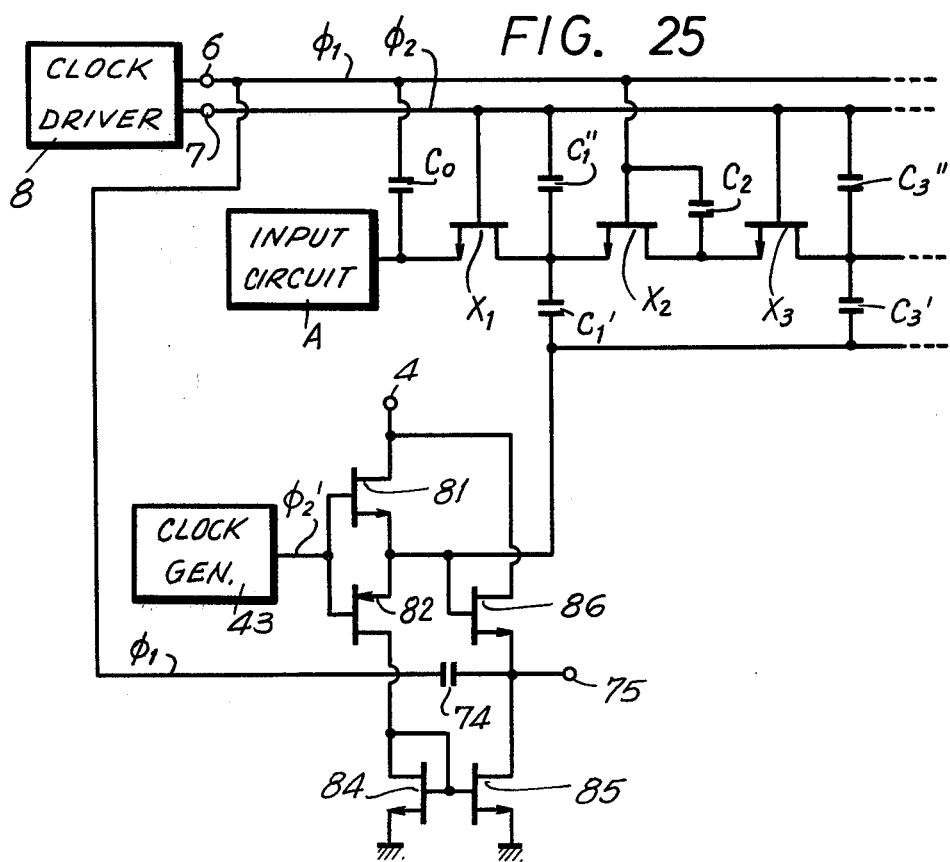

The circuitry of FIGS. 24 and 25 is substantially identical to that of FIGS. 22 and 23, respectively, except that, like the circuitry of FIGS. 14 and 15, it is comprised of field effect transistors rather than of bipolar transistors. The operation of the two circuits in FIGS. 24 and 25 is substantially the same as that of the circuits in FIGS. 22 and 23, respectively.

Figure 26:
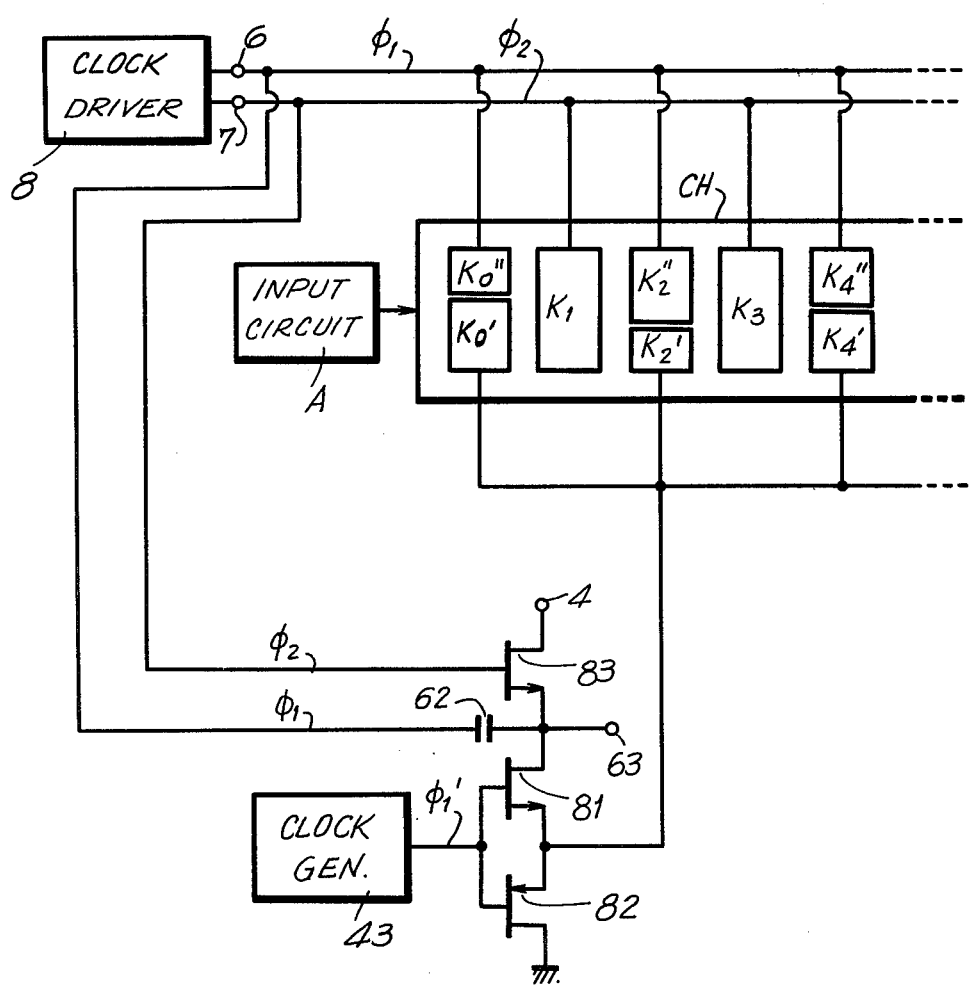
Figure 27:
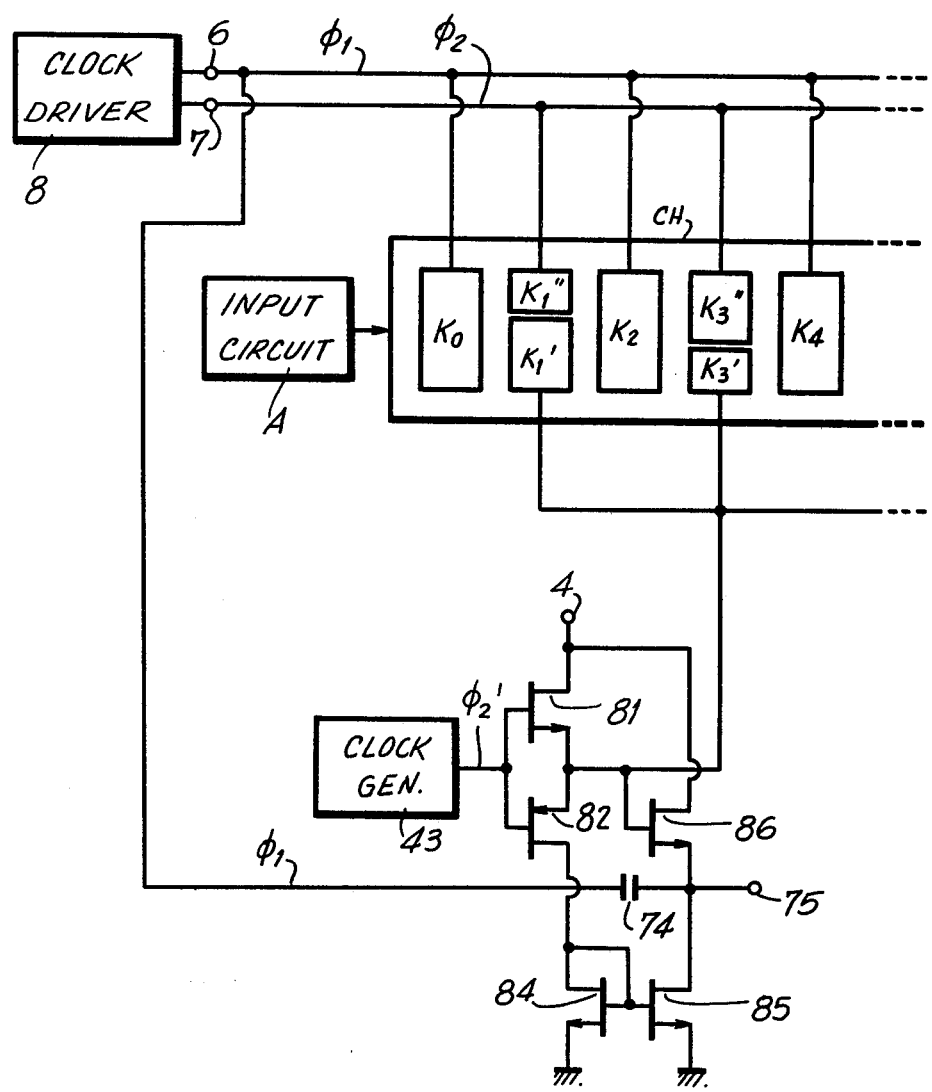

FIGS. 26 and 27 disclose transverse filter circuits made with CCD's. The circuitry of FIGS. 26 and 27 is substantially the same as that of FIGS. 16 and 17, respectively, except that in FIG. 26 the even numbered electrodes of the CCD are each divided into two pieces one of which is connected to the junction of the sources of transistors 81 and 82, and the other of which is connected to the clocking signal input terminal 6. Similarly in FIG. 27 the odd numbered electrodes of the CCD are all split into two pieces, one of which is connected to the junction of the sources of the transistors 81 and 82, and the other of which is connected to the clocking signal input terminal 7.

Whenever charge in the common channel CH is transferred from a capacitive coupling with one electrode to a capacitive coupling with the subsequent electrode, a charge proportional to the transferred charge is transferred away from the discharging electrode, which holds the charge in the channel before the transfer, toward the charging electrode, which holds the charge in the channel after the transfer. By splitting each of the electrodes from which a signal level is to be sampled into two pieces K' and K", it is possible to cause only a desired portion of the total amount of charge that either flows onto or away from each of the sampled electrodes to be added into the output signal derived by the clocking signal drive circuits of FIGS. 26 and 27. As a result, it is possible with the circuits of FIGS. 26 and 27 to derive an output signal which has a desired frequency response, as it is with the circuits of FIGS. 18-25.

Figure 28:
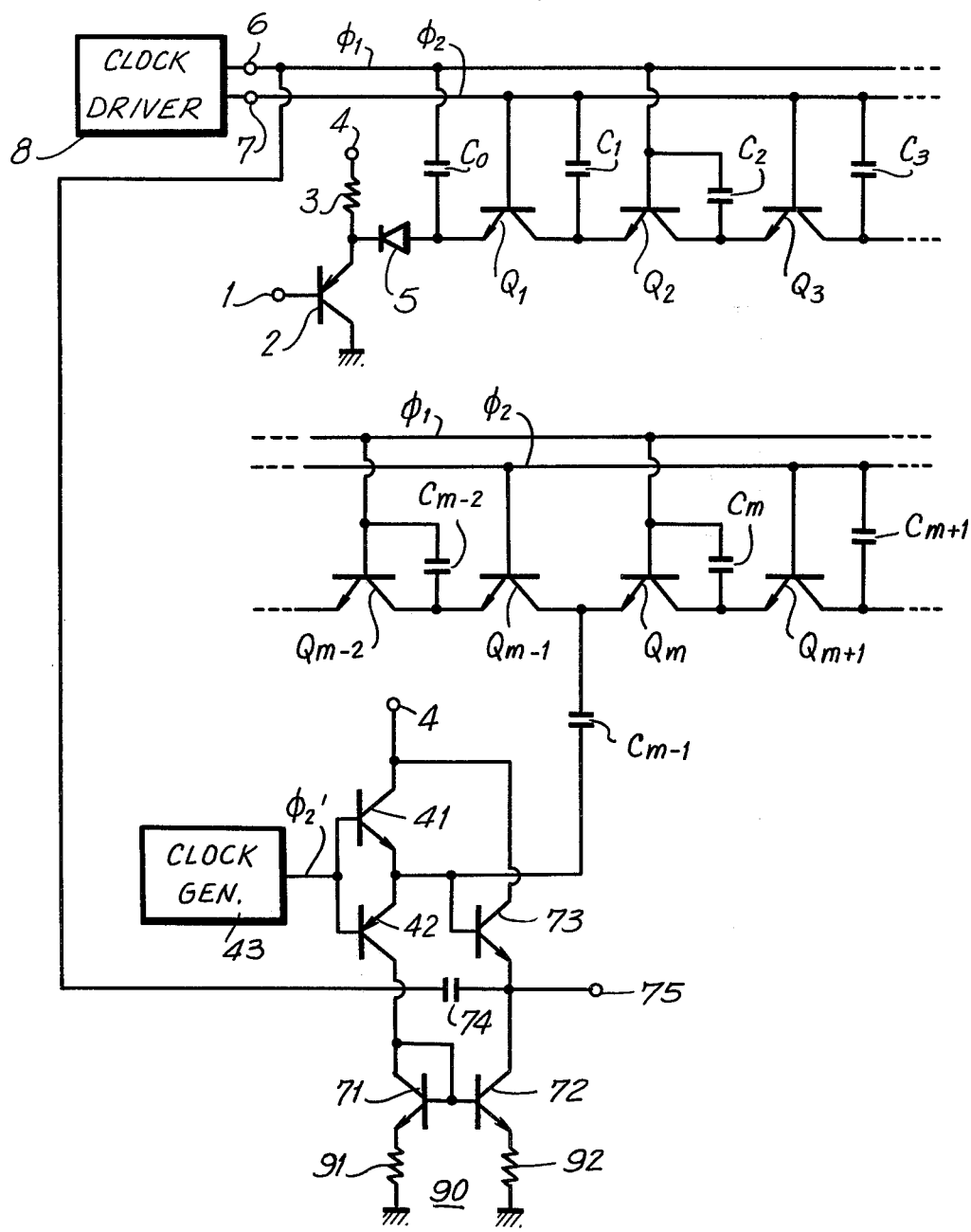
FIGS. 28 and 29 are schematic diagrams of BBDs according to this invention which have a current mirror in their output device for removing any DC level shift introduced into the current level that is transferred in the BBD.

The circuitry of FIG. 28 is substantially identical to that of FIG. 13 except that the clocking signal drive means is connected to a capacitor $C_{m-1}$ rather than the capacitor $C_1$, and that its current mirror circuit 90 has a resistor 91 having a resistance $R_1$ and a resistor 92 having a resistance $R_2$ between the emitters of transistors 71 and 72, respectively, and ground.

As is explained above in regard to the operation of the circuit of FIG. 1, during the period when the clock signal $\phi_2$ is high, the charge of the capacitor $C_{m-1}$ drops down to a value equal to $[V_S - (V_{DC} + V_P) + (V_{DC} + 2V_P - V_S)(1 - \alpha^m)]C$. During the succeeding period when the clocking signal $\phi_1$ is high, charge flows through the transistor $Q_m$ from the capacitor $C_m$ so that the charge on the capacitor $C_{m-1}$ becomes equal to $V_P C$. Thus, the total charge injected into capacitor $C_{m-1}$ during this period is equal to the following:

$$\{V_P - [V_S - (V_{DC} + V_P) + (V_{DC} + 2V_P - V_S)(1 - \alpha^m)]\}C \quad (33)$$

A charge equal to this amount flows from the capacitor $C_{m-1}$ through the emitter-collector path of transistor 42, the collector-emitter path of transistor 71 and through the resistor 91 to ground. Because of the existence of resistors 91 and 92 in the current mirror circuit 90, the amount of current which flows through transistor 72 is equal to $R_1/R_2$ times the amount of current which flows through transistor 71. As a result the amount of charge which flows through transistor 72 during the period that the clocking signal $\phi_1$ is high is as follows:

$$\frac{R_1}{R_2} \{V_P - [V_S - (V_{DC} + V_P) + \quad (34)$$

$$(V_{DC} + 2V_P - V_S)(1 - \alpha^m)]\}C$$

It can be seen that if the values of the resistances $R_1$ and $R_2$ are selected so that $R_1/R_2$ equals $1/\alpha^m$, equation 34 can be rewritten as follows:

$$\frac{1}{\alpha^m} \{V_P - [V_S - (V_{DC} + V_P) + \quad (35)$$

$$(V_{DC} + 2V_P - V_S)(1 - \alpha^m)]\}C =$$

$$\frac{1}{\alpha^m} (V_{DC} + 2V_P - V_S) \cdot \alpha^m \cdot C = (V_{DC} + 2V_P - V_S)C$$

This amount of charge is removed from capacitor 74 so that the charge on capacitor 74 is changed from a value of $V_P \cdot C$ to a value of $V_P \cdot C - (V_{DC} + 2V_P - V_S)C$. As a result the voltage across capacitor 74 drops to a level of $V_S - (V_{DC} + V_P)$. Since at this time the voltage of $V_{DC} + V_P$ is applied to one plate of capacitor 74 by the clocking signal $\phi_1$, the voltage at the other plate of capacitor 74 and the output 75 is equal to $V_S$.

Thus it can be seen that the circuitry of FIG. 28 provides a means for producing an output voltage which is substantially free of changes in the signal level.

In the circuitry of FIG. 28 resistors 91 and 92 are called the balancing resistors of the current mirror circuit 90 because they cause the ratio of the current in the output transistor 72 to the current in the input transistor 71 to vary as a function of the ratio of the resistance $R_1$ to the resistance $R_2$. However, it is possible to create a current mirror circuit in which the ratio between the input and output currents has a desired value other than one without using balancing resistors. This is accomplished by causing the areas of the base-emitter junctions of the input and output transistors 71 and 72, respectively, to differ by a specified ratio. Usually, however, this method is inferior to the use of balancing resistors, because it is much more difficult to accurately determine the areas of the base-emitter junctions of transistors that it is to accurately determine the values of balancing resistors 91 and 92.

In the explanation of the operation of FIG. 28 it was stated that the ratio of the output current to the input current of the current mirror circuit 90 is equal to the ratio of the resistance $R_1$ to $R_2$. Although this is substantially true, it would be more accurate to state the ratio between the input and output current of the current mirror circuit 90 as follows:

$$\frac{I_2}{I_1} = \frac{R_1 + r_{e1}}{R_2 + r_{e2}} \quad (36)$$

Here $r_{e1}$ and $r_{e2}$ are the internal resistances within the transistors 71 and 72, respectively. Generally the internal resistance $R_e$ of a transistor is defined by the following equation:

$$r_e = \frac{dV_{be}}{dI} \quad (37)$$

where I is determined by the following relationship:

$$I = I_0 \exp \frac{q}{KT} V_{be} \quad (38)$$

As a result it can be seen that:

$$\frac{dI}{dV_{be}} = \frac{q}{KT} \left( I_0 \exp \frac{q}{KT} V_{be} \right) = \frac{q}{KT} I \quad (39)$$

so that, $r_e = \frac{1}{I} \frac{KT}{q}$.

Since $I_0$ varies in proportion to the area of the base-emitter junction, it follows that $r_e$ varies in inverse proportion to the area of the base-emitter junction. Therefore if the areas of the base-emitter junctions of the transistors 71 and 72, $A_1$ and $A_2$, respectively, are selected so that $A_2/A_1 = 1/\alpha^m$, and if the values of the resistances $R_1$ and $R_2$ are selected so that $R_2/R_1 = \alpha^m$, then the ratio of the currents $I_1$ to $I_2$ will be as follows:

$$\frac{I_2}{I_1} = \frac{R_1 + r_{e1}}{R_2 + r_{e2}} = \frac{R_1 + r_{e2}}{\alpha^m(R_1 + r_{e1})} = \frac{1}{\alpha^m} \quad (48)$$

Under this condition it can be seen that $I_2/I_1$ will remain constant despite the level of the current signal flowing in the mirror circuit 90 and thus the voltage received at the output 75 in FIG. 28 will have substantially the same value as the voltage originally applied to capacitor $C_0$, regardless of the amount of current that that voltage level causes to flow in the clocking signal drive circuit when the output voltage is derived.

As is stated above, it is difficult to accurately determine the ratio of the areas of the base-emitter junctions of transistors 71 and 72, and thus it is difficult to accurately control the ratio of $r_{e1}$ and $r_{e2}$. But since $R_1$ and $R_2$ are normally selected to be much greater than $r_{e2}$ and $r_{e1}$, it is not critical that the ratio of the area of these base-emitter junctions be exactly as desired. The ratio between the currents $I_2$ and $I_1$ is determined mainly by the values of $R_1$ and $R_2$, but, as the above equations show the ratio between $I_2$ and $I_1$ can be made closer to a desired value if an attempt is made to control the ratio of the base-emitter junctions of transistors 71 and 72.

Figure 29:
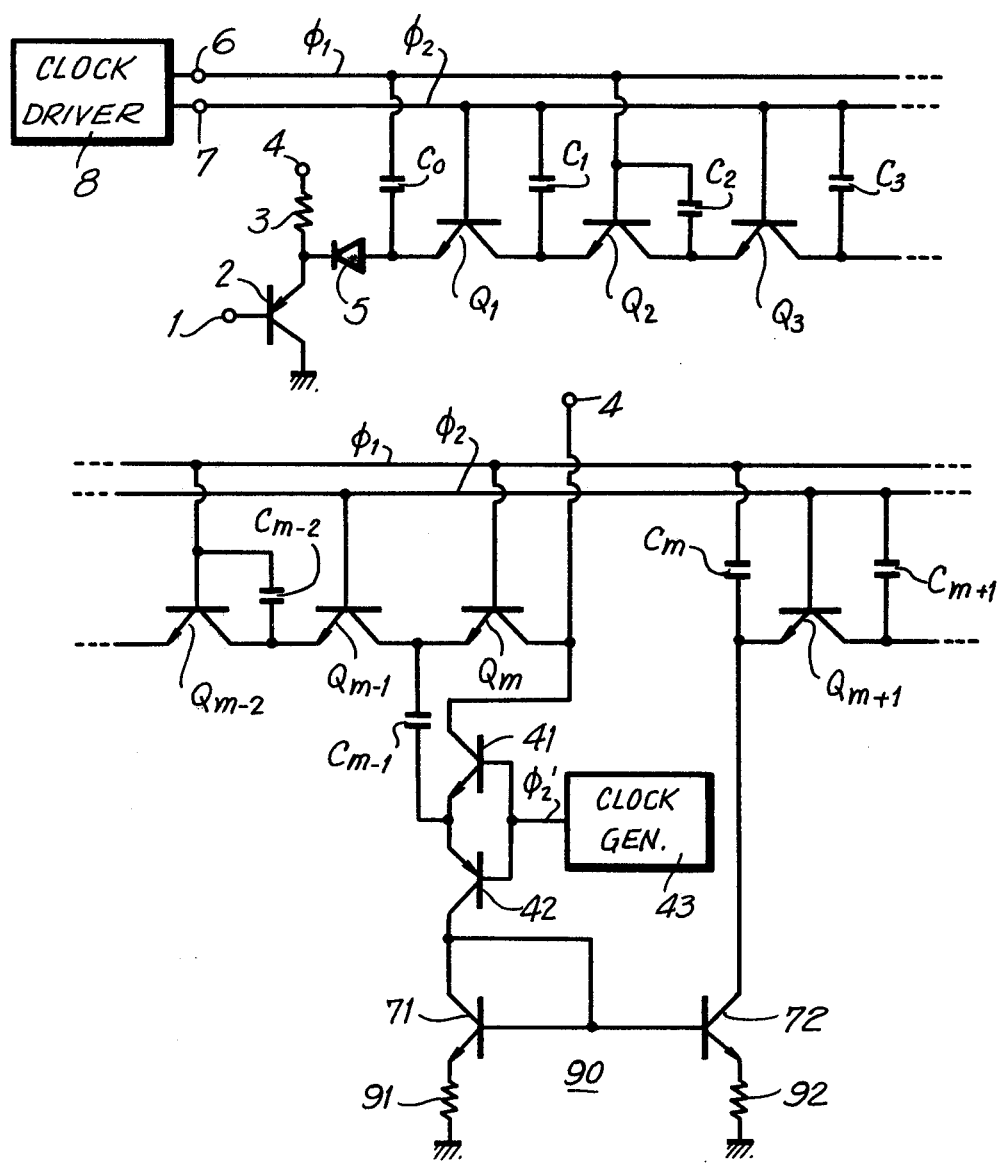

FIG. 29 shows a BBD which is very similar to that shown in FIG. 28 except that transistor 73, capacitor 74 and output terminal 75 are missing. Instead the collector of transistor 72 is connected to the more positive end of capacitor $C_m$ and the emitter of transistor $Q_{m+1}$ in the same manner that that collector is connected to the capacitors 74 and transistor 73 in FIG. 28. Thus the circuitry of FIG. 29 provides a means for removing signal shifts from the voltage signal applied to capacitor $C_m$ similar to the way that FIG. 28 provides a means for removing signal shifts from the voltage signal applied to capacitor 74. As a result the voltage signal $V_S$ applied to the more positive end of the capacitor $C_m$ will be substantially equal to the voltage signal $V_S$ originally applied to the more positive end of the capacitor $C_0$. Thus the circuitry of FIG. 29 provides means for keeping the level of voltage signals applied across capacitor $C_m$ within the range between O and $V_P$ which can be stored upon the capacitors of the BBD. Such a function is particularly important in CTDs having many stages, because in such devices that DC and AC signal shifts which occur after many stages can easily shift an original signal level beyond the operating range of the CTD, making it impossible to determine the original value of such a signal level.

Having described certain preferred embodiments of the invention with reference to the accompanying drawings, it is to be understood that the invention is not limited to those precise embodiments, and that various changes and modifications may be affected therein by one skilled in the art without departing from the scope or spirit of the invention as defined in the appended claims.

What is claimed is:

1. In a charge transfer device having clocking signal drive means for supplying a plurality of clocking signals, a plurality of successive capacitive storage means for sequentially holding a charge level representing a time sampled input signal, each of said capacitive storage means having a clocking electrode for receiving one of said clocking signals, and said charge level being transferred from one to another of said capacitive storage means in succession in response to said clocking signals; said clocking signal drive means comprising at least one clocking signal drive circuit which includes a clocking signal generator having an output at which said generator provides a clocking control signal, a pair of complementary transistors each having first, second and control electrodes, means for connecting control electrodes of said complementary transistors together and to said output of said clocking signal generator, and means for connecting the first electrodes of said complementary transistors together and to the clocking electrode of at least one of said capacitive storage means.

2. A charge transfer device according to claim 1; wherein each of said capacitive storage means comprises a capacitor having two electrodes, one of said two electrodes being said clocking electrode and the other of said two electrodes being a non-clocking electrode; and further comprising a plurality of transfer transistors of the same polarity, each of said transfer transistors being provided for controlling the transfer of charge from a respective one of said capacitors to a succeeding one of said capacitors and each having a control electrode, an input electrode and an output electrode, said transfer transistors being connected in series at their input and output electrodes, and said non-clocking and clocking electrodes of each of said capacitors being connected to the input and control electrodes, respectively, of a related one of the transfer transistors.

3. A charge transfer device according to claim 1; wherein said complementary transistors are bipolar transistors each having a base, an emitter and a collector respectively constituting said control, first and second electrodes.

4. A charge transfer device according to claim 3; wherein said complementary transistors both operate in their active regions.

5. A charge transfer device according to claim 1; wherein said complementary transistors are field-effect transistors each having a gate, a source and a drain respectively constituting said control, first and second electrodes.

6. A charge transfer device according to claim 1; wherein said clocking control signal of said clocking signal generator varies between a high voltage level and a low voltage level; and wherein said second electrode of a first of said pair of complementary transistors is connected to a source of voltage higher than said high voltage level and said second electrode of a second of said pair of complementary transistors is connected to a source of voltage lower than said low voltage level.

7. A charge transfer device according to claim 6; wherein predetermined high and low voltage levels are desired at the clocking electrodes of the capacitive storage means; and wherein said high voltage level of the clocking control signal has a voltage higher than said predetermined high level voltage desired at said clocking electrodes by substantially an offset voltage of said first complementary transistor and said low voltage level of the clocking control signal has a voltage lower than said predetermined low level voltage desired at said clocking electrodes by substantially an offset voltage of said second complementary transistor.

8. A charge transfer device according to claim 1; wherein said at least one clocking signal drive circuit functions as an output device for indicating the charge level on at least one of said capacitive storage means, with one of said complementary transistors being an output transistor; and wherein said clocking signal drive circuit further includes detecting means connected to said second electrode of said output transistor for detecting a current flowing through said output transistor in series with said clocking electrode of said at least one capacitive storage means to which said first electrodes of said complementary transistors are connected.

9. A charge transfer device according to claim 8; wherein said detecting means includes a current-voltage converting means deriving an output voltage which varies as a function of the current flowing through said output transistor.

10. A charge transfer device according to claim 9; wherein said current-voltage converting means includes an output capacitor having two plates, means for placing a known charge across said output capacitor, means for supplying a known voltage to a first of said plates, and means for causing charge to be removed from a second of said plates in an amount having a known relationship to the amount of current flowing through said output transistor so that the amount of current that flows through said output transistor can be determined by the voltage at said second plate of said output capacitor.

11. A charge transfer device according to claim 10; wherein said capacitive storage means are comprised of at least first and second sets thereof with the capacitive storage means of said first and second sets being sequentially interleaved with each other, said clocking signals include at least first and second separate clocking signals which are applied to said clocking electrodes of said capacitive storage means of said first and second sets, respectively, each of said clocking signals alternates between a high voltage level and a low voltage level, and said first and second clocking signals having their respective high voltage levels at different times; and wherein said means for placing a known charge across said output capacitor includes means for charging a voltage across said output capacitor substantially equal to a difference between said high voltage level and said low voltage level of said clocking signals, and said means for supplying a known voltage includes means for supplying a voltage signal to said first plate of said output capacitor which voltage has substantially the same voltage level and phase as said first clocking signal.

12. A charge transfer device according to claim 11; further including a positive voltage supply and wherein said means for placing a known charge includes a transistor having control, input, and output electrodes, with its input electrode connected to said positive voltage supply, its output electrode connected to said second plate of said output capacitor, and with its control electrode receiving said second clocking signal.

13. A charge transfer device according to claim 12; wherein said capacitive storage means and said output capacitor have the same capacitance.

14. A charge transfer device according to claim 10; wherein said means for causing charge to be removed from said second plate of the output capacitor includes a connection between said second plate and said second electrode of said output transistor so that substantially all of the charge that flows through said output transistor is removed from said second plate of said output capacitor.

15. A charge transfer device according to claim 10; wherein said means for causing charge to be removed from said second plate of said output capacitor includes a current mirror device having an input current which is the current flowing through said second electrode of said output transistor and an output current which is used to remove charge from said output capacitor.

16. A charge transfer device according to claim 10; further including a darlington pair emitter-follower circuit having an input and an output, and wherein said second plate of said output capacitor is connected to said input of the darlington pair circuit.

17. A charge transfer device according to claim 8; wherein said clocking signal drive means has another output; and wherein said clocking electrode of each of a predetermined number of said plurality of capacitive storage means is divided into first and second pieces, said first piece of the clocking electrode of each of said predetermined number of said capacitive storage means being connected together to the first electrodes of said complementary transistors, and said second piece of the clocking electrode of each of said predetermined number of capacitive storage means being connected to said other output of said clocking signal drive means.

18. A charge transfer device according to claim 8; further comprising a current mirror circuit including an input active device and an output active device, said current flowing through said output transistor being supplied to said input active device and a current in proportion to the current through said input active device flowing through said output active device as an output current.

19. A charge transfer device according to claim 18; wherein said input active device is a diode, and said output active device is a mirror transistor.

20. A charge transfer device according to claim 19; wherein said current mirror circuit further has a first resistor connected in series with said diode, and a second resistor connected in series with said mirror transistor, whereby the ratio between output current and input current of said current mirror circuit is determined by the ratio of said first and second resistors.

21. A charge transfer device according to claim 20; wherein said charge level representing a time sampled input signal and the voltage it causes when placed upon one of said capacitive storage means are subjected to a level shift in being transferred from one to another of said capacitive storage means; and wherein said ratio of said first and second resistors is determined to compensate for said level shift.

* * * * *